US006894884B2

(12) United States Patent
Anthony, Jr. et al.

(10) Patent No.: US 6,894,884 B2
(45) Date of Patent: May 17, 2005

(54) OFFSET PATHWAY ARRANGEMENTS FOR ENERGY CONDITIONING

(75) Inventors: Anthony A. Anthony, Jr., Erie, PA (US); William M. Anthony, Erie, PA (US)

(73) Assignee: XZY Attenuators, LLC, Erie, PA (US)

( * ) Notice: Subject to any disclaimer, the term of this patent is extended or adjusted under 35 U.S.C. 154(b) by 447 days.

(21) Appl. No.: 10/115,159

(22) Filed: Apr. 2, 2002

(65) Prior Publication Data

US 2002/0158515 A1 Oct. 31, 2002

Related U.S. Application Data

(63) Continuation-in-part of application No. 09/845,680, filed on Apr. 30, 2001, now Pat. No. 6,580,595, which is a continuation-in-part of application No. 09/815,246, filed on Mar. 22, 2001, now Pat. No. 6,469,595, which is a continuation-in-part of application No. 09/777,021, filed on Feb. 5, 2001, now Pat. No. 6,687,108, which is a continuation-in-part of application No. 09/632,048, filed on Aug. 3, 2000, now Pat. No. 6,738,249, which is a continuation-in-part of application No. 09/594,447, filed on Jun. 15, 2000, now Pat. No. 6,636,406, which is a continuation-in-part of application No. 09/579,606, filed on May 26, 2000, now Pat. No. 6,373,673, which is a continuation-in-part of application No. 09/460,218, filed on Dec. 13, 1999, now Pat. No. 6,331,926, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.

(60) Provisional application No. 60/302,429, filed on Jul. 2, 2001, provisional application No. 60/280,819, filed on Apr. 2, 2001, and provisional application No. 60/310,962, filed on Aug. 8, 2001.

(51) Int. Cl.[7] ................................................. H02H 9/00

(52) U.S. Cl. ......................... 361/118; 361/58; 361/111; 361/119

(58) Field of Search ................................ 361/118, 119, 361/127, 111, 113, 58, 15

(56) References Cited

U.S. PATENT DOCUMENTS

| | | |
|---|---|---|
| 3,240,621 A | 3/1966 | Flower, Jr. et al. |
| 3,343,034 A | 9/1967 | Oshinsky |
| 3,573,677 A | 4/1971 | Detar |
| 3,742,420 A | 6/1973 | Harnden, Jr. |

(Continued)

FOREIGN PATENT DOCUMENTS

| | | |
|---|---|---|
| DE | 197 28 692 A1 | 1/1999 |
| DE | 198 57 043 C1 | 3/2000 |
| EP | 0933871 | 8/1999 |

(Continued)

OTHER PUBLICATIONS

PCT International Search Report for PCT/US01/48861.
PCT International Search Report for PCT/US01/44681, Jan. 2, 2003.

(Continued)

*Primary Examiner*—Stephen W. Jackson
(74) *Attorney, Agent, or Firm*—Neifeld IP Law, PC

(57) ABSTRACT

An amalgamation of selected energy pathways and other elements formed at least in-part by sequential manufacturing operations and made operable to be coupled and/or formed as part of a predetermined assembly and/or assemblies and/or assembly variations practicable and/or operable for sustaining electrically opposing and/or complementary energy portion confluences that can be themselves made operable by the arrangement amalgam to undergo portions of energy conditioning as a portion of an energized circuit.

50 Claims, 7 Drawing Sheets

U.S. PATENT DOCUMENTS

| | | |
|---|---|---|
| 3,790,858 A | 2/1974 | Brancaleone et al. |
| 3,842,374 A | 10/1974 | Schlicke |
| 4,023,071 A | 5/1977 | Fussell |
| 4,135,132 A | 1/1979 | Tafjord |
| 4,139,783 A | 2/1979 | Engeler |
| 4,191,986 A | 3/1980 | ta Huang et al. |
| 4,198,613 A | 4/1980 | Whitley |
| 4,259,604 A | 3/1981 | Aoki |
| 4,262,317 A | 4/1981 | Baumbach |
| 4,275,945 A | 6/1981 | Krantz et al. |
| 4,292,558 A | 9/1981 | Flick et al. |
| 4,308,509 A | 12/1981 | Tsuchiya et al. |
| 4,320,364 A | 3/1982 | Sakamoto et al. |
| 4,335,417 A | 6/1982 | Sakshaug et al. |
| 4,353,044 A | 10/1982 | Nossek |
| 4,366,456 A | 12/1982 | Ueno et al. |
| 4,384,263 A | 5/1983 | Neuman et al. |
| 4,394,639 A | 7/1983 | McGalliard |
| 4,412,146 A | 10/1983 | Futterer et al. |
| 4,533,931 A | 8/1985 | Mandai et al. |
| 4,553,114 A | 11/1985 | English et al. |
| 4,563,659 A | 1/1986 | Sakamoto |
| 4,586,104 A | 4/1986 | Standler |
| 4,587,589 A | 5/1986 | Marek |
| 4,590,537 A | 5/1986 | Sakamoto |
| 4,612,140 A | 9/1986 | Mandai et al. |
| 4,612,497 A | 9/1986 | Ulmer |
| 4,636,752 A | 1/1987 | Saito |
| 4,682,129 A | 7/1987 | Bakermans et al. |
| 4,685,025 A | 8/1987 | Carlomagno |
| 4,688,151 A | 8/1987 | Kraus et al. |
| 4,694,265 A | 9/1987 | Kupper |
| 4,698,721 A | 10/1987 | Warren |
| 4,703,386 A | 10/1987 | Speet et al. |
| 4,713,540 A | 12/1987 | Gilby et al. |
| 4,720,760 A | 1/1988 | Starr |
| 4,746,557 A | 5/1988 | Sakamoto et al. |
| 4,752,752 A | 6/1988 | Okubo |
| 4,760,485 A | 7/1988 | Ari et al. |
| 4,772,225 A | 9/1988 | Ulery |
| 4,777,460 A | 10/1988 | Okubo |
| 4,780,598 A | 10/1988 | Fahey et al. |
| 4,782,311 A | 11/1988 | Ookubo |
| 4,789,847 A | 12/1988 | Sakamoto et al. |
| 4,794,485 A | 12/1988 | Bennett |
| 4,794,499 A | 12/1988 | Ott |
| 4,795,658 A | 1/1989 | Kano et al. |
| 4,799,070 A | 1/1989 | Nishikawa |
| 4,801,904 A | 1/1989 | Sakamoto et al. |
| 4,814,295 A | 3/1989 | Mehta |
| 4,814,938 A | 3/1989 | Arakawa et al. |
| 4,814,941 A | 3/1989 | Speet et al. |
| 4,819,126 A | 4/1989 | Kornrumpf et al. |
| 4,845,606 A | 7/1989 | Herbert |
| 4,847,730 A | 7/1989 | Konno et al. |
| 4,904,967 A | 2/1990 | Morii et al. |
| 4,908,586 A | 3/1990 | Kling et al. |
| 4,908,590 A | 3/1990 | Sakamoto et al. |
| 4,924,340 A | 5/1990 | Sweet |
| 4,942,353 A | 7/1990 | Herbert et al. |
| 4,967,315 A | 10/1990 | Schelhorn |
| 4,978,906 A | 12/1990 | Herbert et al. |
| 4,990,202 A | 2/1991 | Murata et al. |
| 4,999,595 A | 3/1991 | Azumi et al. |
| 5,034,709 A | 7/1991 | Azumi et al. |
| 5,034,710 A | 7/1991 | Kawaguchi |
| 5,051,712 A | 9/1991 | Naito et al. |
| 5,059,140 A | 10/1991 | Philippson et al. |
| 5,065,284 A | 11/1991 | Hernandez |
| 5,073,523 A | 12/1991 | Yamada et al. |
| 5,079,069 A | 1/1992 | Howard et al. |
| 5,079,223 A | 1/1992 | Maroni |
| 5,079,669 A | 1/1992 | Williams |
| 5,089,688 A | 2/1992 | Fang et al. |
| 5,105,333 A | 4/1992 | Yamano et al. |
| 5,107,394 A | 4/1992 | Naito et al. |
| 5,109,206 A | 4/1992 | Carlile |
| 5,140,297 A | 8/1992 | Jacobs et al. |
| 5,140,497 A | 8/1992 | Kato et al. |
| 5,142,430 A | 8/1992 | Anthony |
| 5,148,005 A | 9/1992 | Fang et al. |
| 5,155,655 A | 10/1992 | Howard et al. |
| 5,161,086 A | 11/1992 | Howard et al. |
| 5,167,483 A | 12/1992 | Gardiner |
| 5,173,670 A | 12/1992 | Naito et al. |
| 5,179,362 A | 1/1993 | Okochi et al. |
| 5,181,859 A | 1/1993 | Foreman et al. |
| 5,186,647 A | 2/1993 | Denkmann et al. |
| 5,208,502 A | 5/1993 | Yamashita et al. |
| 5,219,812 A | 6/1993 | Doi et al. |
| 5,220,480 A | 6/1993 | Kershaw, Jr. et al. |
| 5,236,376 A | 8/1993 | Cohen |
| 5,243,308 A | 9/1993 | Shusterman et al. |
| 5,251,092 A | 10/1993 | Brady et al. |
| 5,261,153 A | 11/1993 | Lucas |
| 5,262,611 A | 11/1993 | Danysh et al. |
| 5,268,810 A | 12/1993 | DiMarco et al. |
| 5,290,191 A | 3/1994 | Foreman et al. |
| 5,299,956 A | 4/1994 | Brownell et al. |
| 5,300,760 A | 4/1994 | Batliwalla et al. |
| 5,310,363 A | 5/1994 | Brownell et al. |
| 5,311,408 A | 5/1994 | Ferchau et al. |
| 5,321,373 A | 6/1994 | Shusterman et al. |
| 5,321,573 A | 6/1994 | Person et al. |
| 5,326,284 A | 7/1994 | Bohbot et al. |
| 5,337,028 A | 8/1994 | White |
| 5,353,189 A | 10/1994 | Tomlinson |
| 5,353,202 A | 10/1994 | Ansell et al. |
| 5,357,568 A | 10/1994 | Pelegris |
| 5,362,249 A | 11/1994 | Carter |
| 5,362,254 A | 11/1994 | Siemon et al. |
| 5,382,938 A | 1/1995 | Hansson et al. |
| 5,396,201 A | 3/1995 | Ishizaki et al. |
| 5,401,952 A | 3/1995 | Sugawa |
| 5,405,466 A | 4/1995 | Naito et al. |
| 5,414,393 A | 5/1995 | Rose et al. |
| 5,414,587 A | 5/1995 | Kiser et al. |
| 5,432,484 A | 7/1995 | Klas et al. |
| 5,446,625 A | 8/1995 | Urbish et al. |
| 5,450,278 A | 9/1995 | Lee et al. |
| 5,451,919 A | 9/1995 | Chu et al. |
| RE35,064 E | 10/1995 | Hernandez |
| 5,455,734 A | 10/1995 | Foreman et al. |
| 5,461,351 A | 10/1995 | Shusterman |
| 5,463,232 A | 10/1995 | Yamashita et al. |
| 5,477,933 A | 12/1995 | Nguyen |
| 5,481,238 A | 1/1996 | Carsten et al. |
| 5,483,407 A | 1/1996 | Anastasio et al. |
| 5,488,540 A | 1/1996 | Hatta |
| 5,491,299 A | 2/1996 | Naylor et al. |
| 5,493,260 A | 2/1996 | Park |
| 5,495,180 A | 2/1996 | Huang et al. |
| 5,500,629 A | 3/1996 | Meyer |
| 5,500,785 A | 3/1996 | Funada |
| 5,512,196 A | 4/1996 | Mantese et al. |
| 5,531,003 A | 7/1996 | Seifried et al. |
| 5,534,837 A | 7/1996 | Brandt |
| 5,535,101 A | 7/1996 | Miles et al. |
| 5,536,978 A | 7/1996 | Cooper et al. |
| 5,541,482 A | 7/1996 | Siao |
| 5,544,002 A | 8/1996 | Iwaya et al. |

| Patent No. | Date | Inventor |
|---|---|---|
| 5,546,058 A | 8/1996 | Azuma et al. |
| 5,555,150 A | 9/1996 | Newman, Jr. |
| 5,568,348 A | 10/1996 | Foreman et al. |
| 5,570,278 A | 10/1996 | Cross |
| 5,583,359 A | 12/1996 | Ng et al. |
| 5,586,007 A | 12/1996 | Funada |
| 5,592,391 A | 1/1997 | Muyshondt et al. |
| 5,612,657 A | 3/1997 | Kledzik |
| 5,614,881 A | 3/1997 | Duggal et al. |
| 5,619,079 A | 4/1997 | Wiggins et al. |
| 5,624,592 A | 4/1997 | Paustian |
| 5,640,048 A | 6/1997 | Selna |
| 5,647,766 A | 7/1997 | Nguyen |
| 5,668,511 A | 9/1997 | Furutani et al. |
| 5,682,303 A | 10/1997 | Goad |
| 5,700,167 A | 12/1997 | Pharney et al. |
| 5,708,553 A | 1/1998 | Hung |
| 5,719,450 A | 2/1998 | Vora |
| 5,719,477 A | 2/1998 | Tomihari |
| 5,719,750 A | 2/1998 | Iwane |
| 5,751,539 A | 5/1998 | Stevenson et al. |
| 5,767,446 A | 6/1998 | Ha et al. |
| 5,789,999 A | 8/1998 | Barnett et al. |
| 5,790,368 A | 8/1998 | Naito et al. |
| 5,796,568 A | 8/1998 | Baiatu |
| 5,796,595 A | 8/1998 | Cross |
| 5,797,770 A | 8/1998 | Davis et al. |
| 5,808,873 A | 9/1998 | Celaya et al. |
| 5,825,628 A | 10/1998 | Garbelli et al. |
| 5,828,093 A | 10/1998 | Naito et al. |
| 5,828,272 A | 10/1998 | Romerein et al. |
| 5,828,555 A | 10/1998 | Itoh |
| 5,831,489 A | 11/1998 | Wire |
| 5,834,992 A | 11/1998 | Kato et al. |
| 5,838,216 A | 11/1998 | White et al. |
| 5,867,361 A | 2/1999 | Wolf et al. |
| 5,870,272 A | 2/1999 | Seifried et al. |
| 5,875,099 A | 2/1999 | Maesaka et al. |
| 5,880,925 A | 3/1999 | DuPre et al. |
| 5,889,445 A | 3/1999 | Ritter et al. |
| 5,895,990 A | 4/1999 | Lau |
| 5,898,403 A | 4/1999 | Saitoh et al. |
| 5,898,562 A | 4/1999 | Cain et al. |
| 5,905,627 A | 5/1999 | Brendel et al. |
| 5,907,265 A | 5/1999 | Sakuragawa et al. |
| 5,908,151 A | 6/1999 | Elias |
| 5,909,155 A | 6/1999 | Anderson et al. |
| 5,909,350 A | 6/1999 | Anthony |
| 5,910,755 A | 6/1999 | Mishiro et al. |
| 5,912,809 A | 6/1999 | Steigerwald et al. |
| 5,917,388 A | 6/1999 | Tronche et al. |
| 5,926,377 A | 7/1999 | Nakao et al. |
| 5,928,076 A | 7/1999 | Clements et al. |
| 5,955,930 A | 9/1999 | Anderson et al. |
| 5,959,829 A | 9/1999 | Stevenson et al. |
| 5,959,846 A | 9/1999 | Noguchi et al. |
| 5,969,461 A | 10/1999 | Anderson et al. |
| 5,977,845 A | 11/1999 | Kitahara |
| 5,978,231 A | 11/1999 | Tohya et al. |
| 5,980,718 A | 11/1999 | Van Konynenburg et al. |
| 5,995,352 A | 11/1999 | Gumley |
| 5,999,067 A | 12/1999 | D'Ostilio |
| 5,999,398 A | 12/1999 | Makl et al. |
| 6,004,752 A | 12/1999 | Loewy et al. |
| 6,013,957 A | 1/2000 | Puzo et al. |
| 6,016,095 A | 1/2000 | Herbert |
| 6,018,448 A | 1/2000 | Anthony |
| 6,021,564 A | 2/2000 | Hanson |
| 6,023,406 A | 2/2000 | Kinoshita et al. |
| 6,031,710 A | 2/2000 | Wolf et al. |
| 6,034,576 A | 3/2000 | Kuth |
| 6,034,864 A | 3/2000 | Naito et al. |
| 6,037,846 A | 3/2000 | Oberhammer |
| 6,038,121 A | 3/2000 | Naito et al. |
| 6,046,898 A | 4/2000 | Seymour et al. |
| 6,052,038 A | 4/2000 | Savicki |
| 6,061,227 A | 5/2000 | Nogi |
| 6,064,286 A | 5/2000 | Ziegner et al. |
| 6,072,687 A | 6/2000 | Naito et al. |
| 6,075,211 A | 6/2000 | Tohya et al. |
| 6,078,117 A | 6/2000 | Perrin et al. |
| 6,078,229 A | 6/2000 | Funada et al. |
| 6,088,235 A | 7/2000 | Chiao et al. |
| 6,091,310 A | 7/2000 | Utsumi et al. |
| 6,092,269 A | 7/2000 | Yializis et al. |
| 6,094,112 A | 7/2000 | Goldberger et al. |
| 6,094,339 A | 7/2000 | Evans |
| 6,097,260 A | 8/2000 | Whybrew et al. |
| 6,097,581 A | 8/2000 | Anthony |
| 6,104,258 A | 8/2000 | Novak |
| 6,104,599 A | 8/2000 | Ahiko et al. |
| 6,108,448 A | 8/2000 | Song et al. |
| 6,111,479 A | 8/2000 | Myohga et al. |
| 6,120,326 A | 9/2000 | Brooks |
| 6,121,761 A | 9/2000 | Herbert |
| 6,125,044 A | 9/2000 | Cherniski et al. |
| 6,130,585 A | 10/2000 | Whybrew et al. |
| 6,137,392 A | 10/2000 | Herbert |
| 6,142,831 A | 11/2000 | Ashman et al. |
| 6,144,547 A | 11/2000 | Retseptor |
| 6,147,587 A | 11/2000 | Hadano et al. |
| 6,150,895 A | 11/2000 | Steigerwald et al. |
| 6,157,528 A | 12/2000 | Anthony |
| 6,157,547 A | 12/2000 | Brown et al. |
| 6,163,454 A | 12/2000 | Strickler |
| 6,163,456 A | 12/2000 | Suzuki et al. |
| 6,165,814 A | 12/2000 | Wark et al. |
| 6,175,287 B1 | 1/2001 | Lampen et al. |
| 6,180,588 B1 | 1/2001 | Walters |
| 6,181,231 B1 | 1/2001 | Bartilson |
| 6,183,685 B1 | 2/2001 | Cowman et al. |
| 6,185,091 B1 | 2/2001 | Tanahashi et al. |
| 6,188,565 B1 | 2/2001 | Naito et al. |
| 6,191,475 B1 | 2/2001 | Skinner et al. |
| 6,191,669 B1 | 2/2001 | Shigemura |
| 6,191,932 B1 | 2/2001 | Kuroda et al. |
| 6,195,269 B1 | 2/2001 | Hino |
| 6,198,123 B1 | 3/2001 | Linder et al. |
| 6,198,362 B1 | 3/2001 | Harada et al. |
| 6,204,448 B1 | 3/2001 | Garland et al. |
| 6,205,014 B1 | 3/2001 | Inomata et al. |
| 6,207,081 B1 | 3/2001 | Sasaki et al. |
| 6,208,063 B1 | 3/2001 | Horikawa |
| 6,208,225 B1 | 3/2001 | Miller |
| 6,208,226 B1 | 3/2001 | Chen et al. |
| 6,208,494 B1 | 3/2001 | Nakura et al. |
| 6,208,495 B1 | 3/2001 | Wieloch et al. |
| 6,208,501 B1 | 3/2001 | Ingalls et al. |
| 6,208,502 B1 | 3/2001 | Hudis et al. |
| 6,208,503 B1 | 3/2001 | Shimada et al. |
| 6,208,521 B1 | 3/2001 | Nakatsuka |
| 6,208,525 B1 | 3/2001 | Imasu et al. |
| 6,211,754 B1 | 4/2001 | Nishida et al. |
| 6,212,078 B1 | 4/2001 | Hunt et al. |
| 6,215,647 B1 | 4/2001 | Naito et al. |
| 6,215,649 B1 | 4/2001 | Appelt et al. |
| 6,218,631 B1 | 4/2001 | Hetzel et al. |
| 6,219,240 B1 | 4/2001 | Sasov |
| 6,222,427 B1 | 4/2001 | Kato et al. |
| 6,222,431 B1 | 4/2001 | Ishizaki et al. |
| 6,225,876 B1 | 5/2001 | Akino et al. |
| 6,226,169 B1 | 5/2001 | Naito et al. |

| | | |
|---|---|---|
| 6,226,182 B1 | 5/2001 | Maehara |
| 6,229,226 B1 | 5/2001 | Kramer et al. |
| 6,236,572 B1 | 5/2001 | Teshome et al. |
| 6,240,621 B1 | 6/2001 | Nellissen et al. |
| 6,243,253 B1 | 6/2001 | DuPre et al. |
| 6,249,047 B1 | 6/2001 | Corisis |
| 6,249,439 B1 | 6/2001 | DeMore et al. |
| 6,252,161 B1 | 6/2001 | Hailey et al. |
| 6,262,895 B1 | 7/2001 | Forthun |
| 6,266,228 B1 | 7/2001 | Naito et al. |
| 6,266,229 B1 | 7/2001 | Naito et al. |
| 6,272,003 B1 | 8/2001 | Schaper |
| 6,282,074 B1 | 8/2001 | Anthony |
| 6,282,079 B1 | 8/2001 | Nagakari et al. |
| 6,285,109 B1 | 9/2001 | Katagiri et al. |
| 6,285,542 B1 | 9/2001 | Kennedy, III et al. |
| 6,292,350 B1 | 9/2001 | Naito et al. |
| 6,292,351 B1 | 9/2001 | Ahiko et al. |
| 6,309,245 B1 | 10/2001 | Sweeney |
| 6,310,286 B1 | 10/2001 | Troxel et al. |
| 6,313,584 B1 | 11/2001 | Johnson et al. |
| 6,320,547 B1 | 11/2001 | Fathy et al. |
| 6,324,047 B1 | 11/2001 | Hayworth |
| 6,324,048 B1 | 11/2001 | Liu |
| 6,325,672 B1 | 12/2001 | Belopolsky et al. |
| 6,327,134 B1 | 12/2001 | Kuroda et al. |
| 6,327,137 B1 | 12/2001 | Yamomoto et al. |
| 6,331,926 B1 | 12/2001 | Anthony |
| 6,331,930 B1 | 12/2001 | Kuroda |
| 6,342,681 B1 | 1/2002 | Goldberger et al. |
| 6,373,673 B1 | 4/2002 | Anthony |
| 6,388,856 B1 | 5/2002 | Anthony |
| 6,456,481 B1 | 9/2002 | Stevenson |
| 6,469,595 B2 | 10/2002 | Anthony et al. |
| 6,498,710 B1 | 12/2002 | Anthony |
| 6,509,807 B1 | 1/2003 | Anthony et al. |
| 6,522,516 B2 | 2/2003 | Anthony |
| 6,549,389 B2 | 4/2003 | Anthony et al. |
| 6,563,688 B2 | 5/2003 | Anthony et al. |
| 6,580,595 B2 | 6/2003 | Anthony et al. |
| 6,594,128 B2 | 7/2003 | Anthony |
| 6,603,646 B2 | 8/2003 | Anthony et al. |
| 6,606,011 B2 | 8/2003 | Anthony et al. |
| 6,606,237 B1 | 8/2003 | Naito et al. |
| 6,618,268 B2 | 9/2003 | Dibene, II et al. |
| 6,636,406 B1 | 10/2003 | Anthony |
| 6,650,525 B2 | 11/2003 | Anthony |
| 6,687,108 B1 | 2/2004 | Anthony et al. |
| 6,717,301 B2 | 4/2004 | DeDaran et al. |
| 2001/0001989 A1 | 5/2001 | Smith |
| 2001/0002105 A1 | 5/2001 | Brandelik et al. |
| 2001/0002624 A1 | 6/2001 | Khandros et al. |
| 2001/0008288 A1 | 7/2001 | Kimura et al. |
| 2001/0008302 A1 | 7/2001 | Murakami et al. |
| 2001/0008478 A1 | 7/2001 | McIntosh et al. |
| 2001/0008509 A1 | 7/2001 | Watanabe |
| 2001/0009496 A1 | 7/2001 | Kappel et al. |
| 2001/0010444 A1 | 8/2001 | Pahl et al. |
| 2001/0011763 A1 | 8/2001 | Ushijima et al. |
| 2001/0011934 A1 | 8/2001 | Yamamoto |
| 2001/0011937 A1 | 8/2001 | Satoh et al. |
| 2001/0013626 A1 | 8/2001 | Fuji |
| 2001/0015643 A1 | 8/2001 | Goldfine et al. |
| 2001/0015683 A1 | 8/2001 | Mikami et al. |
| 2001/0017576 A1 | 8/2001 | Kondo et al. |
| 2001/0017579 A1 | 8/2001 | Kurata |
| 2001/0019869 A1 | 9/2001 | Hsu |
| 2001/0020879 A1 | 9/2001 | Takahashi et al. |
| 2001/0021097 A1 | 9/2001 | Ohya et al. |
| 2001/0022547 A1 | 9/2001 | Murata et al. |
| 2001/0023983 A1 | 9/2001 | Kobayashi et al. |
| 2001/0024148 A1 | 9/2001 | Gerstenberg et al. |
| 2001/0028581 A1 | 10/2001 | Yanagisawa et al. |
| 2001/0029648 A1 | 10/2001 | Ikada et al. |
| 2001/0031191 A1 | 10/2001 | Korenaga |
| 2001/0033664 A1 | 10/2001 | Poux et al. |
| 2001/0035801 A1 | 11/2001 | Gilbert |
| 2001/0035802 A1 | 11/2001 | Kadota |
| 2001/0035805 A1 | 11/2001 | Suzuki et al. |
| 2001/0037680 A1 | 11/2001 | Buck et al. |
| 2001/0039834 A1 | 11/2001 | Hsu |
| 2001/0040484 A1 | 11/2001 | Kim |
| 2001/0040487 A1 | 11/2001 | Ikata et al. |
| 2001/0040488 A1 | 11/2001 | Gould et al. |
| 2001/0041305 A1 | 11/2001 | Sawada et al. |
| 2001/0043100 A1 | 11/2001 | Tomita et al. |
| 2001/0043129 A1 | 11/2001 | Hidaka et al. |
| 2001/0043450 A1 | 11/2001 | Seale et al. |
| 2001/0043453 A1 | 11/2001 | Narwankar et al. |
| 2001/0045810 A1 | 11/2001 | Poon et al. |
| 2001/0048581 A1 | 12/2001 | Anthony et al. |
| 2001/0048593 A1 | 12/2001 | Yamauchi et al. |
| 2001/0048906 A1 | 12/2001 | Lau et al. |
| 2001/0050550 A1 | 12/2001 | Yoshida et al. |
| 2001/0050600 A1 | 12/2001 | Anthony et al. |
| 2001/0050837 A1 | 12/2001 | Stevenson et al. |
| 2001/0052833 A1 | 12/2001 | Enokihara et al. |
| 2001/0054512 A1 | 12/2001 | Belau et al. |
| 2001/0054734 A1 | 12/2001 | Koh et al. |
| 2001/0054756 A1 | 12/2001 | Horiuchi et al. |
| 2001/0054936 A1 | 12/2001 | Okada et al. |
| 2002/0000521 A1 | 1/2002 | Brown |
| 2002/0000583 A1 | 1/2002 | Kitsukawa et al. |
| 2002/0000821 A1 | 1/2002 | Haga et al. |
| 2002/0000893 A1 | 1/2002 | Hidaka et al. |
| 2002/0000895 A1 | 1/2002 | Takahashi et al. |
| 2002/0003454 A1 | 1/2002 | Sweeney et al. |
| 2002/0005880 A1 | 1/2002 | Ashe et al. |
| 2002/0075096 A1 | 6/2002 | Anthony |
| 2003/0048029 A1 | 3/2003 | DeDaran et al. |
| 2003/0067730 A1 | 4/2003 | Anthony et al. |

FOREIGN PATENT DOCUMENTS

| | | |
|---|---|---|
| EP | 1022751 | 7/2000 |
| EP | 1024507 | 8/2000 |
| EP | 1061535 | 10/2000 |
| EP | 1061535 | 12/2000 |
| FR | 2765417 | 12/1998 |
| FR | 2765417 | 12/1999 |
| FR | 2808135 | 10/2001 |
| JP | 63-269509 | 11/1988 |
| JP | 1-27251 | 1/1989 |
| JP | 02-267879 | 11/1990 |
| JP | 03-018112 | 1/1991 |
| JP | 5-283284 | 10/1993 |
| JP | 06-053048 | 2/1994 |
| JP | 06-053049 | 2/1994 |
| JP | 06-053075 | 2/1994 |
| JP | 06-053077 | 2/1994 |
| JP | 06-053078 | 2/1994 |
| JP | 06-084695 | 3/1994 |
| JP | 06-151014 | 5/1994 |
| JP | 06-151244 | 5/1994 |
| JP | 06-151245 | 5/1994 |
| JP | 06-325977 | 11/1994 |
| JP | 07-235406 | 9/1995 |
| JP | 07-235852 | 9/1995 |
| JP | 07-240651 | 9/1995 |
| JP | 08-124795 | 5/1996 |
| JP | 08-163122 | 6/1996 |
| JP | 08-172025 | 7/1996 |
| JP | 09-284077 | 10/1997 |

| | | |
|---|---|---|
| JP | 09-284078 | 10/1997 |
| JP | 9-294041 | 11/1997 |
| JP | 11-21458 | 8/1999 |
| JP | 11-214256 | 8/1999 |
| JP | 11-223396 | 8/1999 |
| JP | 11-294908 | 10/1999 |
| JP | 11-305302 | 11/1999 |
| JP | 11-319222 | 11/1999 |
| JP | 11-345273 | 12/1999 |
| WO | WO 91/15046 | 10/1991 |
| WO | WO 98/45921 | 10/1998 |
| WO | WO 99/19982 | 4/1999 |
| WO | WO 99/37008 | 7/1999 |
| WO | WO 99/52210 | 10/1999 |
| WO | WO 00/16446 | 3/2000 |
| WO | WO 00/65740 | 11/2000 |
| WO | WO 00/74197 | 12/2000 |
| WO | WO 00/77907 | 12/2000 |
| WO | WO 01/10000 | 2/2001 |
| WO | WO 01/41232 | 6/2001 |
| WO | WO 01/41233 | 6/2001 |
| WO | WO 01/45119 | 6/2001 |
| WO | WO 01/71908 | 9/2001 |
| WO | WO 01/75916 | 10/2001 |
| WO | WO 01/84581 | 11/2001 |
| WO | WO 01/86774 | 11/2001 |
| WO | WO 02/59401 | 1/2002 |
| WO | WO 02/11160 | 2/2002 |
| WO | WO 02/15360 | 2/2002 |
| WO | WO 02/33798 | 4/2002 |
| WO | WO 02/122794 | 4/2002 |
| WO | WO 02/45233 | 6/2002 |
| WO | WO 02/65606 | 8/2002 |
| WO | WO 02/080330 | 10/2002 |
| WO | WO 03/005541 | 1/2003 |

OTHER PUBLICATIONS

Greb, "An Intuitive Approach to EM Fields," EMC Test & Design, Jan. 1991, pp. 30–33.

Greb, "An Intuitive Approach to EM Coupling," Dec. 1, 1993, pp. 20–25.

Sakamoto, "Noiseproof Power Supplies: What's Important to EMI Removal Filters?" JEE, Jun. 1986, pp. 80–85.

Montrose, "Analysis on Loop Area Trace Radiated Emmissions from Decoupling Capacitor Placement on Printed Circuit Boards," IEEE, Jn. 1, 1999, pp. 423–428.

Miyoshi, "Surface Mounted Distributed Constant Type Noise Filter," IEEE, Jan. 15, 1999, pp. 157–160.

Shigeta et al., "Improved EMI Performance by Use of a Three–Terminal–Capacitor Applied to an IC Power Line," IEEE, Jan. 1, 1999, pp. 161–164.

PCT International Search Report for PCT/US99/07653.

IPER for PCT/US99/07653, Oct. 13, 1999.

U.S. Appl. No. 10/479,506, Claims 1–46 from Preliminary Amendment filed Dec. 10, 2003.

U.S. Appl. 10/189,339, Claims 1–41 from Preliminary Amendment filed Oct. 28, 2003.

U.S. Appl. No. 10/443,792, Claims 1–41 from Preliminary Amendment filed Oct. 28, 2003.

PCT International Search Report for PCT/US98/06962, Of Record, Aug. 19, 1998.

PCT International Search Report for PCT/US99/01040, Of Record, Apr. 19,1999.

PCT International Search Report for PCT/US00/11409, Of Record, Sep. 18, 2000.

PCT International Search Report for PCT/US00/14626, Of Record, Sep. 13, 2000.

PCT International Search Report for PCT/US00/16518, Of Record, Nov. 8, 2000.

PCT International Search Report for PCT/US00/21178, Dec. 28, 2000.

Fang et al., "Conductive Polymers Prolong Circuit Life," Design News, date unknown, 3 pages.

Carpenter, Jr. et al., "A New Approach to TVSS Design," Power Quality Assurance, Sep.1/Oct. 1996, pp. 60–63.

Raychem, "Polyswitch Resettable Fuses," Circuit Protection Databook, Jan. 1, 1996, pp. 11–18.

PCT International Search Report for PCT/US01/41720, Dec. 28, 2001.

PCT International Search Report for PCT/US01/09185, Of Record, Jun. 13, 2001.

Polka et al., "Package–Level Interconnect Design for Optimum Electrical Performance," Intel Technology Journal Q3, Jul. 1, 2000, pp. 1–17.

PCT International Search Report for PCT/US01/43418, May 10, 2002.

PCT International Search Report for PCT/US01/32480, Mar. 13, 2002.

PCT International Search Report for PCT/US02/10302, Aug. 19, 2002.

PCT International Search Report for PCT/US02/21238, Feb. 28, 2003.

PCT International Search Report for PCT/US01/13911, Mar. 18, 2002.

PCT International Search Report for PCT/US91/02150, Jul. 16, 2001.

PCT International Search Report for PCT/US01/03792, Jun. 28, 2001.

"Johanson Dielectrics, Inc. Licenses X2Y Circuit Conditioning Technology," Press Release, Dec. 16, 1998, 1 page.

Beyne et al., "PSGA—an innovative IC package for single and multichip designs," Components, Mar. 1, 1997, pp. 6–9.

"EMC Design for Brush Commutated DC Electric Motors," Sep. 15, 1997, pp. 1–2.

"Tomorrow's Capacitors," Compnents, Apr. 1, 1996, No. 4, p. 3.

Mason, "Valor–Understanding Common Mode Noise," Mar. 30, 1998, pp. 1–7.

Anthony Anthony et al., Pending specification, claims, figures for U.S. Appl. No. 10/237,079, Claims 21–81; filed Sep. 9, 2002.

William Anthony, Pending specification, claims, figures for U.S. Appl. No. 10/399,630, Claims 1–35; filed Aug. 27, 2003.

Anthony Anthony et al., Pending specification, claims, figures for U.S. Appl. No. 10/432,840, Claims 1–39; filed May 28, 2003.

William Anthony, Pending specification, claims, figures for U.S. Appl. No. 10/443,482, Claims 1–25; filed Jun. 12, 2003.

Anthony Anthony et al., Pending specification, claims, figures for U.S. Appl. No. 10/435,199, Claims 1–32; filed May 12, 2003.

Anthony Anthony et al., Pending specification, claims, figures for U.S. Appl. No. 10/115,159, Claims 1–31; filed Apr. 2, 2002.

Anthony Anthony et al., Pending specification, claims, figures for U.S. Appl. No. 10/189,338, Claims 1–69; filed Jul. 2, 2002.

Anthony Anthony et al., Pending specification, claims, figures for U.S. Appl. No. 10/189,339, Claims 1–41; filed Jul. 2, 2002.

Anthony Anthony et al., Pending specification, claims, figures for U.S. Appl. No. 10/479,506, Claims 1–46; filed Dec. 10, 2003.

Anthony Anthony, Pending Specification, claims, figures for U.S. Appl. No. 10/443,764, Claims 26–40; filed Sep. 16, 2003.

Anthony Anthony, Pending specification, claims, figures for U.S. Appl. No. 10/443,792, Claims 1–41; filed May 23, 2003.

Anthony Anthony, Pending specification, claims, figures for U.S. Appl. No. 10/443,788, Claims 1; 21–45; filed May 23, 2003.

Anthony Anthony et al., Pending specification, claims, figures for U.S. Appl. No. 10/443,778, Claims 1; 21–59; filed May 23, 2003.

Anthony Anthony et al., Pending specification, claims, figures for U.S. Appl. No. 10/460,361, Claims 1–16; filed Jun. 13, 2003.

Anthony Anthony et al., Pending specification, claims, figures for U.S. Appl. No. 10/705,962, Claims 1–18; filed Nov. 13, 2003.

Anthony Anthony, Pending specification, claims, figures for U.S. Appl. No. 10/369,335, Claims 1–20; Feb. 18, 2003.

Anthony Anthony et al., Pending specification, claims, figures for U.S. Appl. No. 09/647,648, Claims 1–48; filed Nov. 17, 2000.

Anthony Anthony, Pending specification, claims, figures for U.S. Appl. No. 10/328,942, Claims 1–20; filed Dec. 23, 2002.

Anthony Anthony et al., Pending specification, claims, figures for U.S. Appl. No. 09/632,048, Claims 1–20; filed Aug. 3, 2000.

Anthony Anthony et al., Pending specification, claims, figures for U.S. Appl. No. 09/996,355, Claims 1–73; filed Nov. 29, 2001.

William Anthony, Pending specification, claims, figures for U.S. Appl. No. 10/023,467, Claims 1–20; filed Dec. 17, 2001.

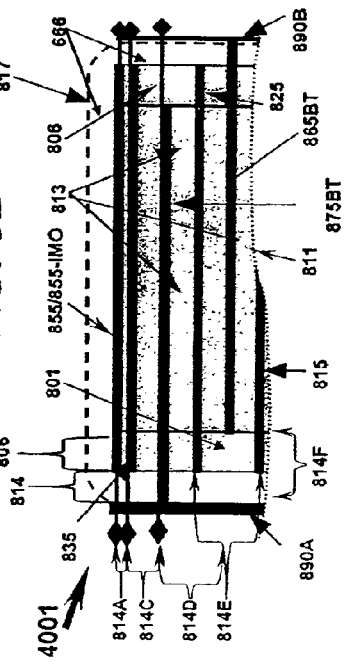
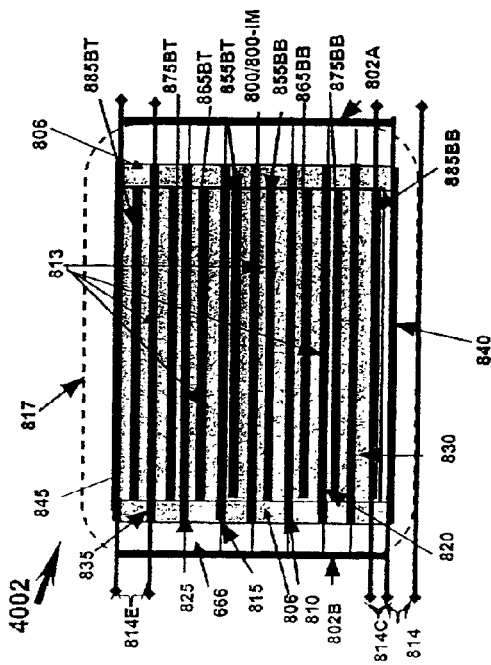
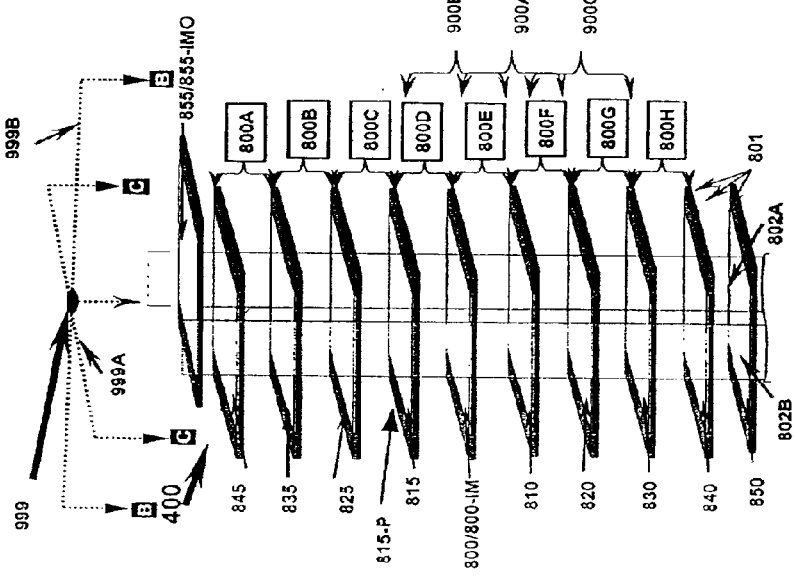

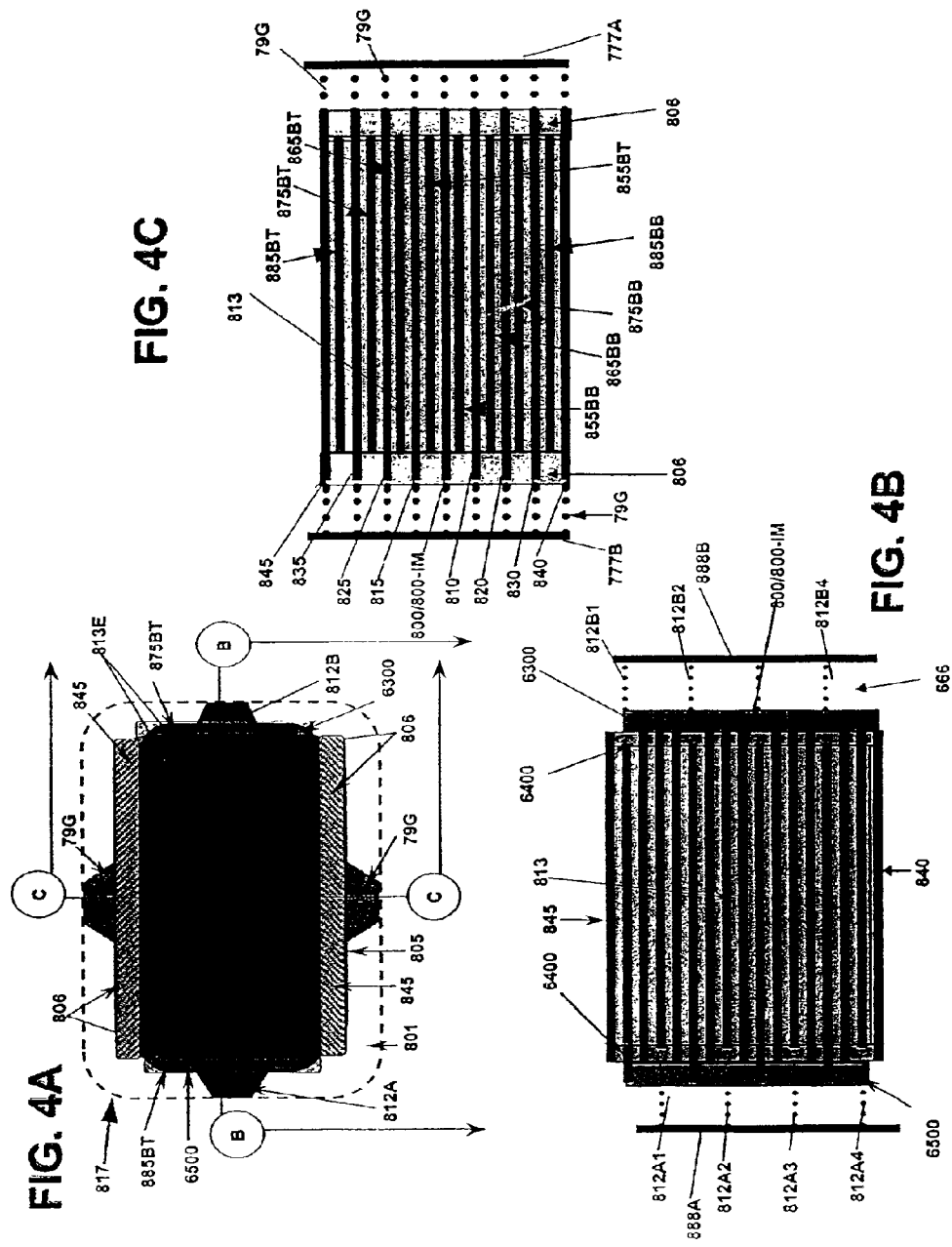

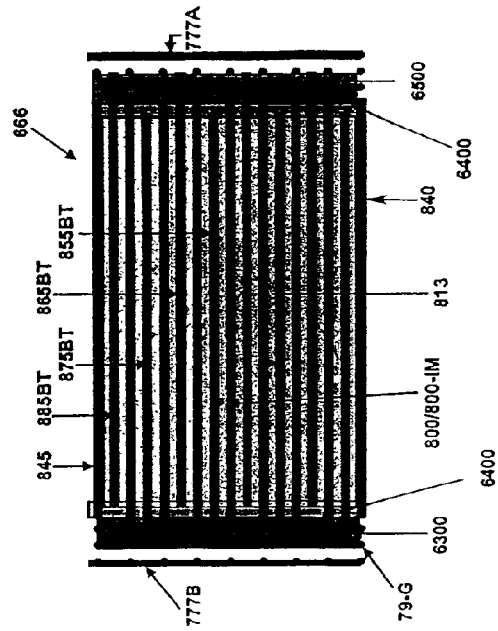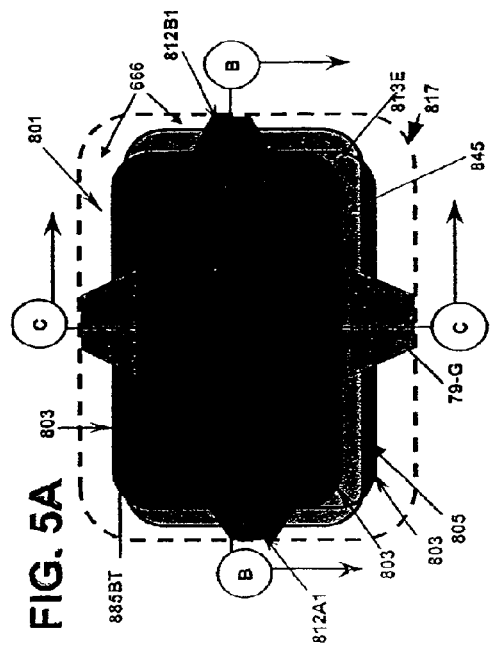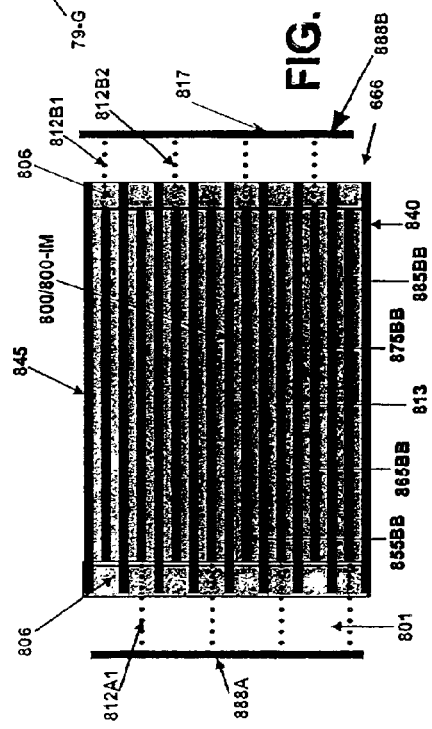

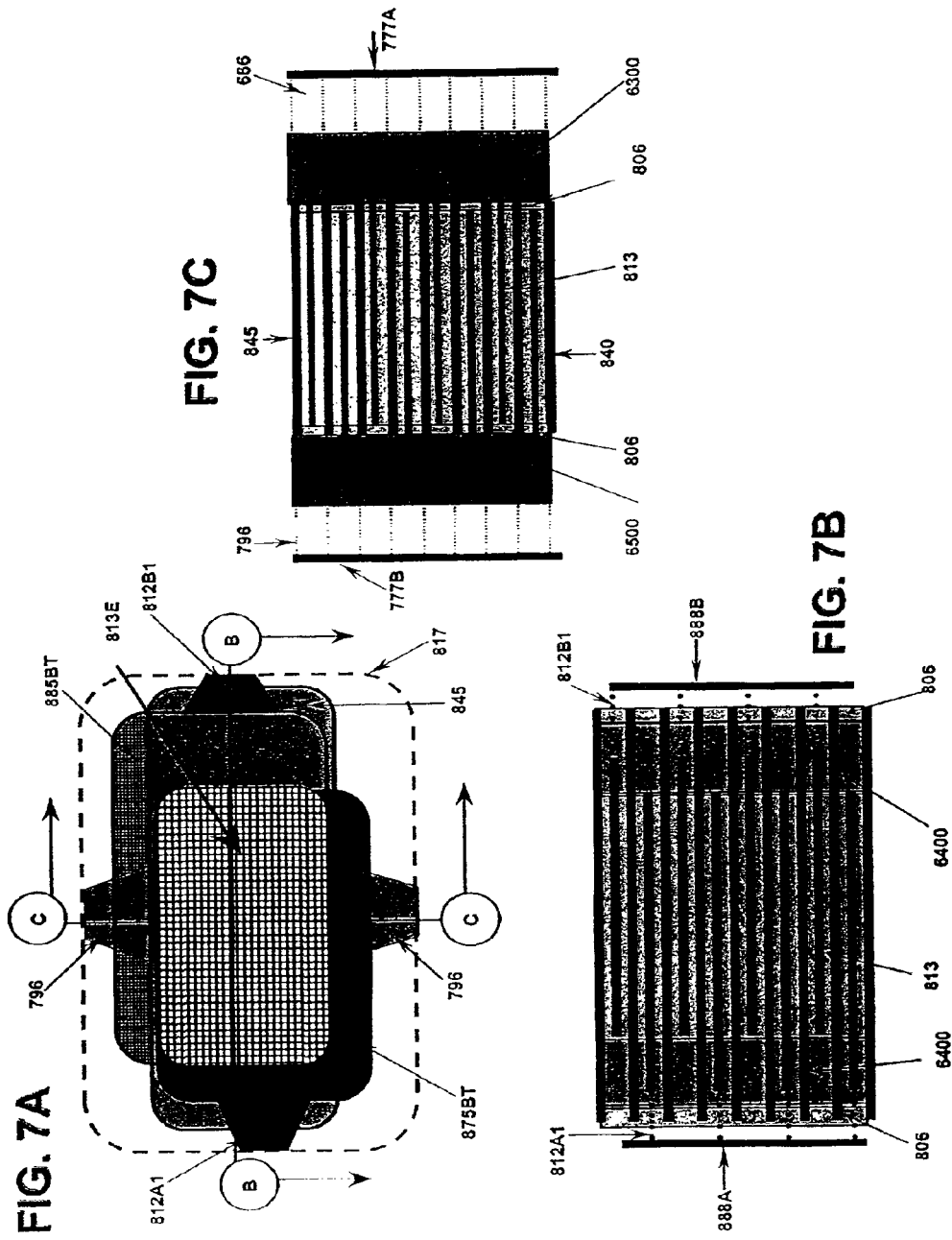

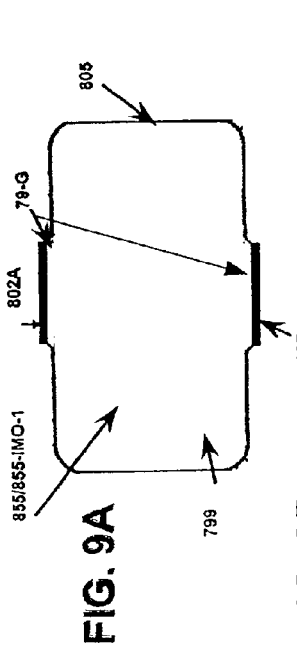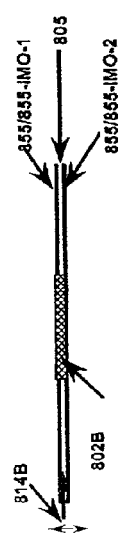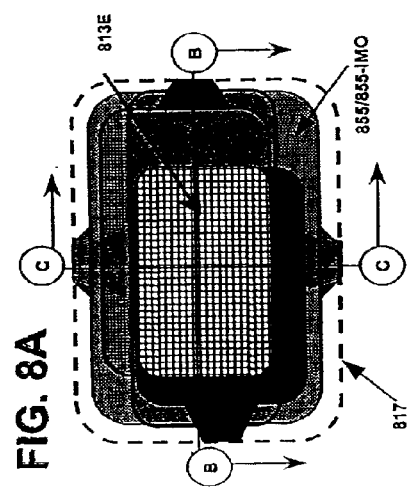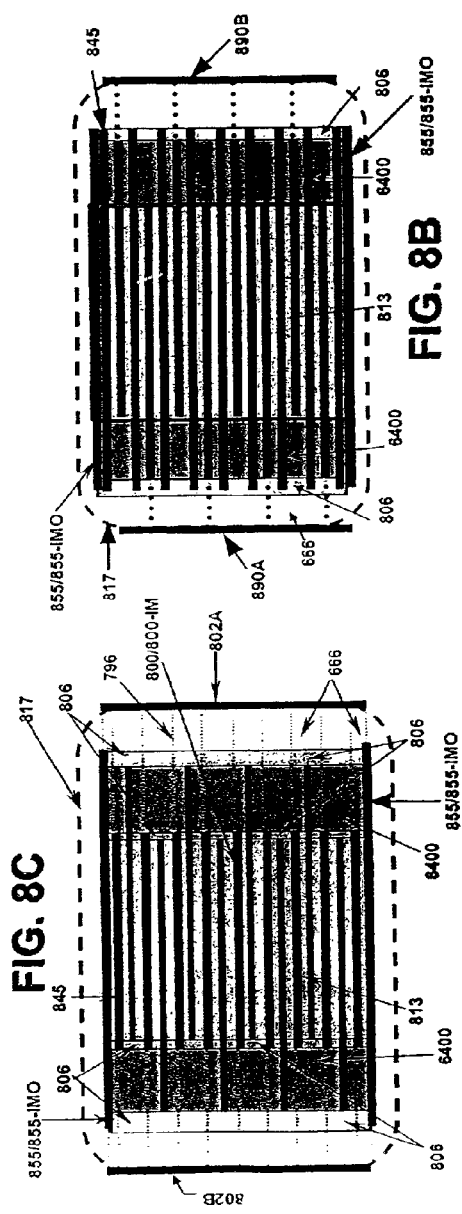

OFFSET PATHWAY ARRANGEMENTS FOR ENERGY CONDITIONING

CROSS REFERENCE TO RELATED APPLICATIONS

This application is a continuation-in-part of application Ser. No. 09/845,680, filed Apr. 30, 2001 now U.S. Pat. No. 6,580,595, which is a continuation-in-part of application Ser. No. 09/815,246 filed Mar. 22, 2001 now U.S. Pat. No. 6,469,595, which is a continuation-in-part of application Ser. No. 09/777,021 filed Feb. 5, 2001 now U.S. Pat. No. 6,687,108, which is a continuation-in-part of application Ser. No. 09/632,048 filed Aug. 3, 2000 now U.S. Pat. No. 6,738,249, which is a continuation-in-part of application Ser. No. 09/594,447 filed Jun. 15, 2000 now U.S. Pat. No. 6,636,406, which is a continuation-in-part of application Ser. No. 09/579,606 filed May 26, 2000, now U.S. Pat. No. 6,373,673, which is a continuation-in-part of application Ser. No. 09/460,218 filed Dec. 13, 1999, now issued as U.S. Pat. No. 6,331,926, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350; and this application No. 10/115,159 also claim the benefit of U.S. Provisional Application No. 60/280,819, filed Apr. 2, 2001, U.S. Provisional Application No. 60/302,429, filed Jul. 2, 2001, and U.S. Provisional Application No. 60/310,962, filed Aug. 8, 2001.

Each one of the applications: 09/845,680; 09/815,246; 09/777,021; 09/632,048; 09/594,447; 09/579,606; 09/460,218; 09/056,379; 09/008,769; 08/841,940; 60/280,819; 60/302,429; and 60/310,962 are incorporated herein by reference.

TECHNICAL FIELD

This application relates to a predetermined, substantially symmetrically balanced amalgam that uses complementary relative offset groupings of energy pathways, such as electrodes, for various energy portion propagations, which relative offset groupings can be practicable, in-turn, for multiple energy conditioning functions. These arrangements and/or at least select variants thereof can be operable as discrete or non-discrete embodiments practicable and/or operable for sustaining electrically opposing and/or complementary energy portion confluences, which energy portion confluences, in accordance with the amalgam, undergo portions of energy conditioning as a portion of an energized circuit.

BACKGROUND

Today, as the density of electronics within typical system applications increases, unwanted noise byproducts of the increased density limit the performance of critical and non-critical electronic circuitry. Consequently, the avoidance of the effects of unwanted noise byproducts, such as by isolation or immunization of circuit portions against the effects of the undesirable noise is an important consideration for most circuit arrangements and circuit design.

Differential and common mode noise energy can be generated by, and may propagate along and/or around, energy pathways, cables, circuit board tracks or traces, high-speed transmission lines, and/or bus line pathways. In many cases, these energy conductors may act as, for example, an antenna radiating energy fields. This antenna-analogous performance may exacerbate the noise byproduct problem in that, at higher frequencies, propagating energy portions utilizing prior art passive devices may experience increased levels of energy parasitic interference, such as various capacitive and/or inductive parasitics.

These increases can be due, in part, to the combination of constraints due to the functionally and/or structurally limitations of prior art solutions, coupled with the inherent manufacturing and/or design imbalances and/or performance deficiencies of the prior art. These deficiencies inherently create, or induce, operability highly conducive to unwanted and/or unbalanced interference energy that couples into an associated electrical circuitry, thereby making at least partial shielding from these parasitics and EMI desirable. Consequently, for broad frequency operating environments, solution of these problems necessitates at least a combination of simultaneous filtration of input and output lines, careful systems layout having various grounding or anti-noise arrangements, as well as extensive at least partial isolating in combination with at least partial electrostatic and/or electromagnetic shielding.

Thus, a need exists for a self-contained, energy-conditioning arrangement utilizing simple, predetermined arrangements of energy pathways and other predetermined elements that, when amalgamated into a discreet or non-discreet component, may be utilized in almost any circuit application for providing effective, symmetrically balanced, and sustainable, simultaneous energy conditioning functions selected from at least a decoupling function, transient suppression function, noise cancellation function, energy blocking function, and energy suppression functions utilizing at least a partial physical shielding as well as at least partial electrostatic shielding derived from a shielding energy pathway arrangement.

BRIEF DESCRIPTION OF THE DRAWINGS

Understanding of an exemplary embodiment will be facilitated by consideration of the following detailed description of illustrative embodiments taken in conjunction with the accompanying drawings, in which like numerals refer to like parts, and wherein:

FIG. 3A is an exploded view of an exemplary embodiment of an amalgamated shielding structure having grouped, shielding structures, portions of which can be designated as 900"X", and which further may include paired shielding electrode containers, portions of which can be designated as 800"X". Center axis 999 is depicted, as can be lines 999B and 999C, each of which represents a cross-section, in accordance with at least one embodiment of a number of possible exemplary embodiments of the energy pathway arrangement;

FIG. 3B is a 999B cross-section view of a portion of an exemplary embodiment of a multiple energy pathway arrangement, in accordance with the exemplary embodiment of FIG. 1;

FIG. 3C is a 999C cross-section view of a portion of an exemplary embodiment of a multiple energy pathway arrangement, in accordance with the exemplary embodiment of FIG. 2;

FIG. 4A is a semi-transparent, top plan view of at least one embodiment of a number of possible embodiments of the energy pathway arrangement;

FIG. 4B is a "999B" cross-section view of at least one embodiment of a number of possible exemplary embodiments of the energy pathway arrangement with various selected areas of predetermined energy portion interactions as illustrated in FIG. 4A;

FIG. 4C is a "999C" cross-section view of at least one embodiment of a number of possible embodiments of the energy pathway arrangement with various selected areas of predetermined energy portion interactions as illustrated in FIG. 4A;

FIG. 5A is a semi-transparent, top plan view of at least one embodiment of a number of possible embodiments of the energy pathway arrangement;

FIG. 5B is a "999B" cross-section view of at least one embodiment of a number of possible embodiments of the energy pathway arrangement with various selected areas of predetermined energy portion interactions as illustrated in FIG. 5A;

FIG. 5C is a "999C" cross-section view of at least one embodiment of a number of possible embodiments of the energy pathway arrangement with various selected areas of predetermined energy portion interactions as illustrated in FIG. 5A;

FIG. 7A is a semi-transparent, top plan view of at least one embodiment of a number of possible embodiments of the energy pathway arrangement;

FIG. 7B is a "999B" cross-section view of at least one embodiment of a number of possible embodiments of the energy pathway arrangement with various selected areas of predetermined energy portion interactions as illustrated in FIG. 7A;

FIG. 7C is a "999C" cross-section view of at least one embodiment of a number of possible embodiments of the energy pathway arrangement with various selected areas of predetermined energy portion interactions as illustrated in FIG. 7A;

FIG. 8A is a semi-transparent, top plan view of at least one embodiment of a number of possible embodiments of the energy pathway arrangement;

FIG. 8B is a "999B" cross-section view of at least one embodiment of a number of possible embodiments of the energy pathway arrangement with various selected areas of predetermined energy portion interactions as illustrated in FIG. 8A;

FIG. 8C is a "999C" cross-section view of at least one embodiment of a number of possible embodiments of the energy pathway arrangement with various selected areas of predetermined energy portion interactions as illustrated in FIG. 8A;

FIG. 9A shows a top plan with offsets view of a portion of a typical shielding energy pathway depicting a typical 'spilt' electrode configuration;

FIG. 9B shows a portion of a side plan view depicting FIG. 9A;

DESCRIPTION OF THE INVENTION

Figure 2:
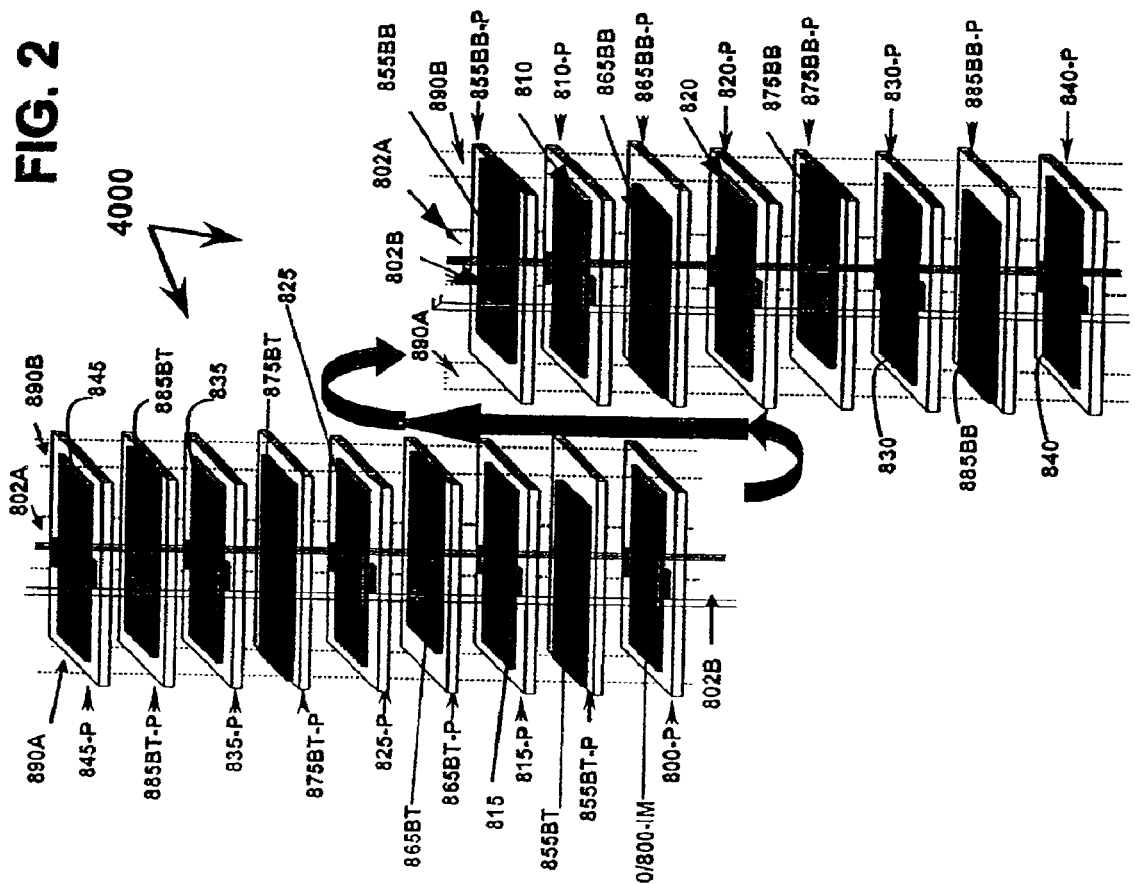
FIG. 2 is a exploded view of a stacking sequence of at least one exemplary embodiment of a shielding electrode architecture having bypass electrodes shown without any optional final sandwiching outer "-IM" shielding electrodes in accordance with at least one embodiment of a number of possible exemplary embodiments of the energy pathway arrangement.

It is to be understood that the figures and descriptions can be illustrative of at least one embodiment of a number of possible embodiments of an energy pathway arrangement, and have been simplified in order to illustrate elements that can be relevant for a clear understanding of at least one embodiment of a number of possible embodiments, while eliminating, for purposes of clarity, many other elements found in a typical energy conditioning device, system, and method. Those of ordinary skill in the art will recognize that other elements can be desirable and/or required in order to implement at least one embodiment of a number of possible embodiments of a energy pathway arrangement. However, because such elements are well known in the art, and because they do not facilitate a better understanding of any exemplary embodiment presented herein, a discussion of such elements is not provided herein. The disclosure herein below is directed to all such variations and modifications to energy conditioning devices, systems, and/or methods as are known, and will be apparent, to those skilled in the art.

As the term is used generally herein, an "energy pathway", in accordance with at least one embodiment of a number of possible embodiments of an energy pathway arrangement, may be at least one, or a number, of conductive material portions, each one operable for sustained propagation of energy portions. Energy pathways may be conducive, and/or conductive by way of physical make-up, to better propagate various electrical and/or energies, as compared to non-conductive or semi-conductive materials directly coupled and/or adjacent to the energy pathways.

An energy pathway within at least one embodiment of a number of possible embodiments of an energy pathway arrangement may facilitate propagation of energy portions by allowing for various, simultaneous energy conditioning functions on those energy portions because of the orientation and positioning of the energy pathways within the energy pathway arrangement, which in-turn allows for interaction of various energy portions with other propagating complementary energy portions.

An energy pathway may include an energy pathway portion, an entire energy pathway, an energy pathway, and/or a conductor, and/or an energy conductor, and/or an electrode, and/or at least one process-created conductor, and/or an electrode, and or a shielding. A plurality of energy pathways may include a plurality of each device or element discussed hereinabove with respect to energy pathway.

A type of energy pathway may include a shielding. A shielding may include a shielding energy pathway, a shielding energy pathway portion, a shielded energy pathway portion, a shielded energy pathway, and/or shielded conductor, and/or shielded energy conductor, and/or shielded electrode, and/or at least one process-created shielded energy pathway portion, and/or shielded conductor, and/or shielded energy conductor, and/or "shielded electrode". A plurality of shieldings may include a plurality of the devices or elements discussed hereinabove with respect to shielding.

A type of energy pathway may be a conductor and/or an electrode. As used generally herein, and with respect to propagating energy portions, an individual, or complementary positioned and/or orientated conductor, and/or energy conductor, and/or electrode, may, for example include a pairing of physically opposing, or oppositely orientated relative to one another, conductor, and/or electrodes, that may thereby be electrically complementary and/or electrically differential. Further, as used generally herein, conductor(s) and/or electrode(s) may include, for example, an individual conductive material portion, electrical wire, such as a resistive lead, conductive material portions, electrical plates, such as plates separated by at least one medium 801, and/or a separation portion, and the like, for example.

In an illustrative embodiment, energy pathway arrangement may include at least a shielding positioned at least a partially shield energy pathways, in part or in whole, and/or as a conductive shielding structure with respect to at least an isolated and/or conductively isolated pairing of at least two energy pathways, such as an electrode, such as complementary paired electrodes.

Additionally, as used generally herein, the term "AOC" 813 may include at least a portion of a predetermined and/or selected three-dimensional area within at least one embodiment of a number of possible embodiments of an energy pathway arrangement practicable for sustaining complementary energy portion confluences and/or interactions that may undergo energy conditioning. Thus, an AOC 813 may be a result of a predetermined manufactured sequence of various selected and/or predetermined and/or arranged pairing of energy pathways and a shielding, of which these pathways may allow predetermined energy conditioning functions, resulting from energy propagation, to occur or take place upon portions of complementary propagating energies pathed within an AOC 813.

As used herein, the term "ALI" may include a portion of a predetermined and/or selected three-dimensional area of at least one embodiment of a number of possible embodiments of an energy pathway arrangement, that may be practicable for less sustenance of complementary energy portion confluences than a comparable AOC 813, at least in part due to the fact that the ALI may be or include, for example, a space, an empty or non-electrical physical area, an insulating area, or another area type, such as an area created by an arrangement of the energy pathways, that results in such lacking at least a portion of an energy pathway arrangement that would otherwise allow for a more balanced interaction of energy confluences. For example, ALI may be formed of, or may include, portions designated 806, 6400, 666 6300, and 6500, respectively, as these 6400, 806, 666, 6300, and 6500 areas may have lesser energy conditioning and/or balanced interaction, and/or confluence capability than a comparable AOC 813.

In addition, as used generally herein, the terms "outer" or "external" may include locations up to, and/or beyond, the typical effective energy-conditioning range or influence, spacing or area, of an AOC 813, as defined hereinabove. Outer or external, as used generally herein, need not be separate of an AOC 813, and need not be contiguously apart from other elements included in an energy pathway arrangement and/or an AOC 813. Thus, for example, outer or external, as used herein, may apply to all, or a majority, of the locations of electrode extensions 79·X' with respect to AOC 813, irrespective of a contiguous relation to the main body portion 80 of that electrode.

In an illustrative energy pathway arrangement embodiment, among others, for example, such as illustrated with respect to FIGS. 1, 2, 3, and 7A, wherein the various propagating energy portions can be complementary, the energy pathway arrangement, upon placement into a circuit arrangement(s), may allow for energy propagation within and/or along certain portions of energy pathways of the energy pathway arrangement, thereby allowing for the mutual interaction of oppositely moving portions of electrode-sourced magnetic fields produced by the propagation of energy field currents emanating outwardly from each of the complementary conductors. This mutual cancellation may occur wherein certain electrodes can be partially or totally physically shielded from other complementary electrodes, and can be placed within an influencing distance (s). Further, a substantial similarity in size and/or shape of the respective complementary electrodes, the spaced-apart relationship of the electrodes, the interpositioning of a shielding, as well as the conductively isolated relationship of the electrodes may contribute to this mutual cancellation effect.

Further, in accordance with at least one embodiment of a number of possible embodiments of an energy pathway arrangement, the complementary electrodes may be substantially the same in size, shape, and/or position, and may be subjected to a plurality of shielding dynamics partially within a simultaneously operating shielding structure, in which electrostatic shielding may effect portions of energy propagating through or about the shielding structure. It will be understood herein by those of ordinary skill that the use of the terms substantially similarly or equally sized or shaped, complementary sized or shaped, or same or equal sized or shaped, or the like, incorporates the common understanding in the art of manufacturing tolerances and/or commonly practiced manufacturing in the state of the art, such as manufacturing practices that may be employed by original equipment manufacturers (OEM) in the construction of an energy pathway arrangement as described herein.

Although the electrostatic shielding may be mutually exclusive to each portion of the respective complementary conductor during the shielding, dynamic shielding additionally results from a specific, predetermined, relative positioning, internal to the energy pathway, which positioning results in an electrostatic shielding that is dependant upon a plurality of variables including, but not limited to, predetermined physical placement and location of each of the respective complementary electrode portions through which energy propagates during energizing of the respective electrode portions. For example, the predetermined amalgamation of selected electrodes and/or shielding may be formed, at least in part, using a sequential manufacturing operation, such as that used to form a multi-functional energy-conditioner.

Thus, the shielding dynamic operations discussed hereinabove may be predicated, at least in-part, on a predetermined positioning of a first of the respective complementary electrodes relative to a second of the respective complementary electrodes, wherein the first of the complementary electrodes and the second can be complements to one another, and thereby form "paired mates". Additionally, the shielding operations may be predicated on a relative positioning of the paired mate electrodes with respect to at least a portion of the conductive electrostatic shielding structure. At least the complementary energy conditioning functions and electrostatic shielding dynamics discussed herein may operate on various energy portions propagating in various directions along various predetermined energy pathways within an AOC 813, and may operate simultaneously with circuit operation of an energy pathway arrangement within, for example, a predetermined master circuit necessitating a desired master circuit behavior.

In accordance with at least one embodiment of a number of possible embodiments of an energy pathway arrangement, a sub-combination of electromagnetically/electrostatically actuated impedance states may develop along or within a portion of an energy pathway arrangement, and/or along or within a closely coupled, predetermined external conductive portion that is coupled conductively to the shielding energy pathways, to thereby form a predetermined energy conditioning circuit. These electromagnetically/electrostatically actuated impedance states may develop, for example, because of the energization of the paired, energy pathways.

In accordance with at least one embodiment of a number of possible embodiments of an energy pathway arrangement as discussed herein, each shielding may include a main body portion 81. Main body portions 81 may collectively and conductively couple to one another, and at the same time may substantially immure and shield the main body portions 80 of the electrode(s). Alternatively, the collective shielding main body portions 81 may only partially immure and/or shield the electrode main-body portion 80s.

In accordance with at least one embodiment of a number of possible embodiments of an energy pathway arrangement, due to a symmetry, certain superposed shielding energy pathways, complementary energy pathways sizing and shaping, and reciprocal positioning and pairing of the complementary energy pathways relative to the other, a balanced, symmetrical, energy pathway arrangement may be resultant. Manufacturable balanced and/or symmetrical physical arrangements of energy pathways, wherein dynamic energy propagations and/or interactions or pairings or match-ups of various dynamic quantities, such as complementary energy propagations or quantities, cannot be simultaneously measured and/or may operate at less than a fundamental limit of accuracy of typical testing equipment, may result. Thus, when portions of these complementary energy quantities interact simultaneously within a range of space, such as AOC 813, such as a space parallel to the measurement circuit, the energy portions, an/or the interaction thereof, may be beyond the quantifiable range of the typical testing equipment, and thus may be beneath a 'testing floor'.

A measurement capability, or a desired result, such as an electrical enhancement or characteristic variation, may be obtained due to a predetermined arrangement of elements that maintains a complementary balance, symmetry relative to a fixed or imaginary point or center reference axis and/or point 999

Thus, the extent to which the measurement can be obtained may be controllable, and thereby, the electrical characteristics, or the effect on electrical characteristics, may be controllable, by predetermining the desired measurability, or behavior, or enhancement to be provided, by the arrangement of the elements, and by an arrangement of the elements to provide the desired measurability or effect. For example, a desired electrical characteristic and/or variance may be predetermined for subjecting to a desired enhancement by varying at least a portion of the complementary balance, size, shape, and/or symmetry of at least one energy pathway pairing, as set forth herein below with respect to at least one embodiment of a number of possible embodiments of an energy pathway arrangement, and as illustrated in FIGS. 4–9.

Thus, variables such as the extent of energy interactions, mutual energy propagation timings, or interferences, for example, may be controllable by exerting control over tolerances within the energy pathway arrangement. These tolerances may be controllable, for example, by manually controlling a manufacture process, or by computer tolerance control, such as semiconductor process control. Thus, the energy pathways of an exemplary embodiment may be formed using manufacturing processes, such as passive device processes, apparent to those skilled in the art, the tolerances of which processes will be apparent to those skilled in the art. Mutual energy portion propagation timings or measurements may thereby be cancelled or suppressed by the formation of the energy pathway arrangement of an exemplary embodiment, in accordance with the ordinary understanding of those terms in the art.

Accordingly, at least one predetermined manufacturing process can be utilized to create an energy pathway arrangement resulting in a sequentially positioned arrangement of relatively positioned groupings of electrodes in an amalgamated electronic structure having balanced groupings of predetermined energy pathways. The balanced grouping of predetermined energy pathways may include a predetermined electrode architecture having a stacked hierarchy of electrodes, symmetrical and complementary in number, and positioned complementary to one another and/or substantially equidistant on each side of a centrally positioned shielding, wherein each shielding energy pathway may provide at least a portion of a symmetrical balancing point for the overall electrode hierarchy. Thus, predetermined differential and/or complementary sized, shaped, and/or positioned electrodes are present on either side of the centrally positioned shielding. Thereby, the energy pathway is symmetrically divided into a predetermined complementary physical format that may include a reverse-mirror image positioning of paired differential and/or complementary sized and/or shaped electrodes, sandwiching at least one interposing shielding. This illustrative embodiment may be termed a symmetrical complementary energy pathway arrangement, and may include, for example, a reflected, or a rotated, translation of the embodiment discussed immediately hereinabove.

The energy pathway arrangement may additionally include conductive structures, electrode portions, electrode termination elements, or conductive portions, such as those that can be practicable for attachment of the elements of the energy pathway arrangement to an external device, circuit, or circuit portion. Further, it will be apparent to those skilled in the art that the energy pathway arrangement may be made operable, such as for a predetermined effect, such as an incoming external energy conditioning, by combination with, and/or and conductive coupling to, at least one predetermined external device, circuit, or circuit portion. For example, predetermined conductive coupling of at least a portion of an energy pathway arrangement to at least one external device, circuit, or circuit portion may allow for a specifically attainable energy conditioning function to be applied to at least one energy portion propagating to, from, and/or through the external device, circuit, or circuit portion and the at least a portion of the at least one energy pathway. Such at least one energy portion may include complementary energies, electrically opposite, and/or electrically polar opposite energy portions. Additionally, the energy pathway arrangement may be operable as a discrete component.

In accordance with at least one embodiment of a number of possible embodiments of an energy pathway arrangement, each electrode may be, for example, a substrate, a deposit, an etching, a resultant of, for example a doping process, and the shielding may be, for example, an electrode substrate, a deposit, an etching, a resultant of, for example, a doping process, and may have, for example, resistive properties.

In accordance with at least one embodiment of a number of possible embodiments of an energy pathway arrangement, shielding may be operable for at least two energy conditioning functions simultaneously, such as, for example, providing a circuit with a low impedance energy pathway, and/or common voltage reference, and/or an image plane function, and/or an energy blocking function, wherein, for example, a shielding energy pathway, such as 400 of FIG. 3A, serves as at least a shielding and isolating at least partially physically interposed barrier operable for shielding electrostatically. These functions may be provided, for example, wherein a shielding energy pathway sandwiches at least a portion of each of the same-sized, complementary electrodes of a complementary electrode pairing. The use of same-sized complementary electrodes may allow for, for example, economical construction of many possible variants of at least one embodiment of a number of possible embodiments of an energy pathway arrangement. For example, close positioning of internal, parallel complementary energy pathways of at least one embodiment of a number of possible embodiments of an energy pathway arrangement may allow for development of a low impedance energy pathway or blocking function that may develop upon or along a shielding energy pathway that is not integral to direct energized circuit operation, nor is directly coupled to internal, parallel complementary energy pathways.

A portion of at least a third energy pathway found within at least one embodiment of a number of possible embodiments of an energy pathway arrangement may be near, or indirectly adjacent to and partially surrounding most, if not all, of at least portions of a first and a second energy pathway. Thereby, in accordance with at least one embodiment of a number of possible embodiments of an energy pathway arrangement, at least two, but three or more, isolated energy pathways may be provided. For example, wherein a first and a second energy pathway can be at least each respective of at least a pairing of differential and/or complementary energy pathways and/or power/return pathways, simultaneously at least a third energy pathway may be physically and conductively separated from the first and a second energy pathway by at least portions of a medium 801 and/or material portions 801.

In accordance with at least one embodiment of a number of possible embodiments of an energy pathway arrangement at least a third energy pathway may be utilized for conductive coupling to predetermined portions of circuitries and/or bus lines, and/or an isolated ground and/or isolated conductive area and/or external conductive area (all not shown), for example, rather than utilizing, for example, at least first and second predetermined portions of circuitries and/or bus lines, operable electrically isolated from direct physical coupling to one another, thus providing for a means of broad-band frequency bypassing and/or decoupling.

This energy pathway arrangement can thus minimize, suppress, decouple, filter, or otherwise modify wanted or unwanted electrical or electromagnetic emissions, for example, such as those resulting from differential and common mode currents, by placement in combination with externally coupled and positioned circuit portions or devices. Further, the energy pathway arrangement can provide balancing in that the shielding energy pathway may include a conductive shielding structure formed from an odd integer number of superposed, shielding electrodes, wherein the total shielding structure exerts a balancing effect on the paired, complementary electrodes adjacent to the shielding energy pathway.

Thus, while at least one embodiment of a number of possible embodiments of an energy pathway arrangement allows for smoothing and energy conditioning operations, various desired degrees of smoothing and/or energy conditioning operations can be a function of predetermined contrasts of energy conditioning desired, due to various and respective predetermined arrangements of main body complementary electrode portions 80s verses each other collectively, as well as a pairing and/or verses main body shielding electrode portions 81s. These desired function(s) may be due, in part, to other relationships, such as various and respective relative size differences, symmetry and/or balancing arrangements, overall relative to and respective of a fulcrum, energy pathway such as 800/800-IM, and/or complementarity of position and/or placement, as well as a shield and/or shielding electrode superposition or a desired energy leakage allowed, and/or non-attachment and/or non-coupling of certain elements within at least one embodiment of a number of possible embodiments of an energy pathway arrangement and/or external to at least one embodiment of a number of possible embodiments of a new energy pathway arrangement family.

In addition, at least one embodiment of a number of possible embodiments of an energy pathway arrangement may be placed into a circuit, device, or circuit portion, and may be energized to provide electromagnetic interference (EMI) filtering, such as simultaneous differential mode and common mode filtering, across a desired and/or predetermined frequency range. The predetermined frequency range may be broad, or narrow, as selected, and is dependent on the electrode, and/or medium 801, and/or shielding selection, and or the element placement selection, as will be apparent to those skilled in the art. A simultaneous, differential mode and common mode filtering function can be utilized with at least one embodiment of a number of possible embodiments of a new energy pathway arrangement family to provide, in many cases, a surge protection function that can be used as well for circuitry attached between a source and an energy utilizing-load.

The predetermined positional shifting of paired, multi-layered offset electrodes of an exemplary embodiment may be, for example, configured in a substantially bypassed, or a feed-thru configuration, and may be formed as portions of single chips, or multi-terminal or multi-point electrode chip array assemblies, for example, and, as set forth herein, can be physically shielded, in whole or in-part, from each other, nearby and/or adjacent offset electrode. More specifically, the energy pathway of an exemplary embodiment may include a passive, superimposed, shielding and electrode architecture in at least one predetermined arrangement for relatively broad-frequency energy transmissions without degradation, or failure, such as, for example, at energization.

In a more specific embodiment of at least one embodiment of a number of possible embodiments of an energy pathway arrangement, material 801, having predetermined desirable conditioning properties, may be interposed and non-conductively coupled to a substantial number of points surrounding the various elements, such as conductors and/or electrodes, of the energy pathways, in order to provide spacing between energy pathways and/or electrodes, and/or to facilitate conductive coupling between conductive portions within an energy pathway, and/or to insulate the electrodes of the arrangement, and/or to provide structural support, and/or to provide the proper spaced-apart distances between the shielding and the electrodes of the arrangement.

These materials 801 may be oriented in a generally enveloping and adjoining relationship with respect to the electrodes, for example. Materials 801 may not have uniform properties throughout each material 801, or as between materials 801, and non-uniformities may vary the electrical properties of all, or a portion, of the energy pathway arrangement. Materials 801, or portions thereof, may be selected from insulators, including air, semi-insulators, dielectrics, including high K constant and low K constant dielectrics, capacitive materials, inductive materials, ferromagnetic material, ferrites, shales, metal oxides, varistors, laminates, chemically doped materials, multi-layered materials, semiconductor materials, such as silicon, germanium, gallium-arsenate and gallium arsenide, or compounds or combinations of these and other materials. In a typical embodiment, material 801 will include insulating properties, such as, for example, an X7R, MOV, or COG material 801. Additionally, for example, a polyimide polymer in the form factor of a flexible film, resulting from a polycondensation reaction between pyromellitic dianhydride and four diaminodiphenyl ether, or any derivative of such, which polymer may additionally be combined with other compounds or materials, may be implemented as material 801, as will be apparent to those skilled in the art.

It should be noted that portions of material 801 having predetermined properties may not be provided separately from conductive materials. In this case, material 801 may not necessarily, at first, be practicable or operable for receiving electrode material deposits, but may later be made operable for receipt of such, such as wherein electrode 799, or energy pathway material 799 is partially derived from, or partially or wholly created by, a process that includes at least a portion of material 801 that has been chemically altered, manipulated, doped, or processed with catalysts, from an original state of semi-conductivity or non-conductivity, to a state of conductivity.

Further, in this more specific embodiment of at least one embodiment of a number of possible embodiments of an energy pathway arrangement, an energy pathway, such as a conductor and/or a flexible conductive material, may be selected from Ag, Ag/Pd, Cu, Ni, Pt, Au, Pd and/or other metals, and/or conductively made materials, and/or combinations thereof, and these conductors may be combined with resistive materials, such as a metal oxide, such as ruthenium oxide, which resistive materials may be diluted with a suitable dilution, to form energy pathways. Further, energy pathways may include, and/or be formed by, substances and processes used to create conductive materials, such as Mylar films or printed circuit board materials, doping of polysilicon, sintered polycrystalline, metals, polysilicon silicates, or polysilicon silicides, for example. Additionally, various hybrid polymer films, plasma-treated surfaces, vacuum-deposits, metalized thin films, foil capacitors, PP and PPT for passive devices, radiation-curable acrylate polymers having plasma-treated surface(s), such as taught in U.S. Pat. No. 6,214,422, which is incorporated herein by reference, may be used to form energy pathways. It will be apparent to those skilled in the art the energy pathways may not have uniform properties throughout, and may not have consistent properties as between energy pathways.

For example, a thin film passive device may be formed in accordance with at least one embodiment of a number of possible embodiments of an energy pathway arrangement, using multilayer passive components, such as those having energy densities of at least 0.5 J/cm.sup.3, wherein there can be at least three pluralities of interleaved, vacuum-deposited metal electrode layers, wherein each electrode layer is separated by deposited, or vacuum-deposited, cured or radiation-cured, polymer dielectric portions, formed by first depositing a monomer layer, and by radiation-curing the monomer layer, to define the electrode active region. These interleaved metal electrode layer pluralities may be terminated at each respective outer perimeter edge portion by single layer or multilayer, sputtered or soldered, material portion or conductive material coated termination portion. Formation of this device may include a continuous, one-step process in a vacuum, for example, wherein each electrode may be formed by metal evaporation. Forming the metal layer on the polymer layer may be repeated to form the various pluralities of interleaved, vacuum-deposited metal electrodes separated by the vacuum-deposited, radiation-cured polymer dielectric portions. The multilayer passive component may then be cut into a plurality of multilayer passive components, such as by cutting along a first direction to form a single passive energy conditioning strip that can then be cut into individual passive energy conditioning components, and along a second direction that can be orthogonal to the first direction. By cutting the individual passive energy conditioning components, electrode layers can be set into, or recessed into, the polymer layers along electrode edges orthogonal to an opposite electrode end not necessarily set into or recessed into the polymer layers, for example, thereby forming a non-conducting portion or region that may prevent arcing and/or leakage current between the electrode layers along the orthogonal edges or perimeter portions.

In this more specific embodiment, at least a first, a second, and a third shielding having substantially common shape and size, and each being conductively coupled to one another, sandwich at least a first and a second electrode of substantially common size and shape, wherein the first electrode may be at least partially sandwiched between the first and the second shielding, and wherein the second electrode may be at least partially sandwiched between the second and the third shielding. The first and the second electrode may be at least partially, or may be fully, isolated and shielded from one another, and may be disposed in a symmetrical and/or complementary arrangement relative to the other, wherein the first and the second electrode may each have at least one corresponding, face to face electrode area substantially equal in size to another at least one corresponding area, and wherein, in addition, the first and the second electrode may each have at least one corresponding, non-face to face electrode area that may be substantially equal to another corresponding non-face to face area. Any of the face-to-face areas, non face-to-face areas, the electrodes, and/or the shielding may be flexible, semi-flexible, or rigid.

This energy pathway arrangement may then be coupled to a larger circuit arrangement, such as for testing or conditioning. A circuit arrangement circuit may, for example, evidence voltage dividing and balancing of opposing pressures internally to the grouped, adjacent electrodes, and/or may allow for a minimized hysteresis or piezoelectric effect within the circuit arrangement. These effects can be frequently encountered in the prior art wherein a switching response or particular time constraint is needed to provide instantaneous energy propagation, and these effects can be remedied by the use of an exemplary embodiment. Thereby, with at least one embodiment of a number of possible embodiments of an energy pathway arrangement, embodiments may appear, in, for example, a bypass or feed through configuration, as an open energy propagation simultaneously on both electrical sides of a common energy reference, such as the third energy pathway discussed hereinabove, such as along energy-in and energy-out pathways connected or coupled from an energy source to a respective load, and/or from the load back to the source. The alternating electrode and material of the energy pathways in accordance with at least one embodiment of a number of embodiments of an energy pathway arrangement, may operate as an energy conditioner effective at up to 1000 Volts (V), with a capacitance in the nanoFarad (nF) to 1-farad (F) range, dependant, at least in part, upon the overall size and the number of electrode pairs disposed between the shieldings.

In this more specific embodiment, other elements of the arrangement may be oriented in a generally parallel relationship with respect to one another, and/or certain elements may be oriented in a perpendicular relationship. Thus, the energy pathways may be horizontally positioned, or vertically positioned. All elements described herein may include, for example, non-insulated and conductive apertures, or conductive thru-vias, and yet still maintain a separate electrical relationship with an adjoining element or circuit.

Differential capacitive balance, or tolerance balancing, characteristics of an exemplary embodiment may arise, and be controllable by variations in, element positioning, size, and separations, as well as attachment positioning, and may allow for an energy pathway arrangement, manufactured, for example, at 3% capacitive tolerance internally. Balancing is discussed further hereinbelow with respect to FIGS. 4–10. This internal balance may pass to an attached or coupled and energized circuit the correlated 3% capacitive tolerance.

Figure 1:
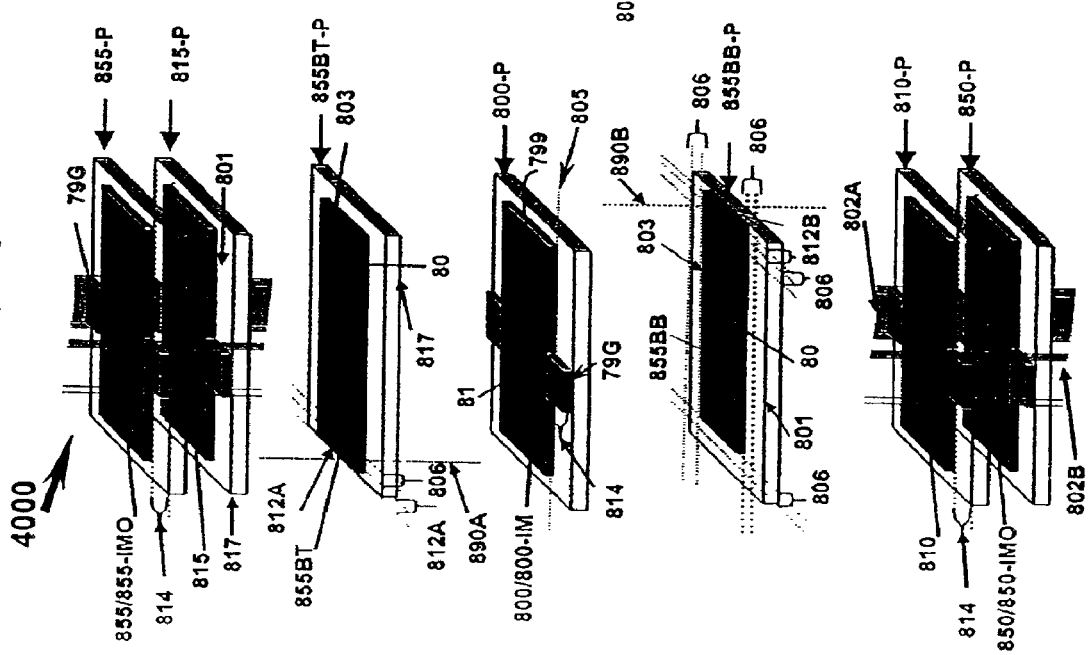
FIG. 1 is a exploded view of a minimum stacking sequence of an exemplary embodiment of a shielding electrode architecture having bypass electrodes with optional outer "-IM" shielding electrodes, in accordance at least one embodiment of a number of possible exemplary embodiments of the energy pathway arrangement.
Figure 6A:
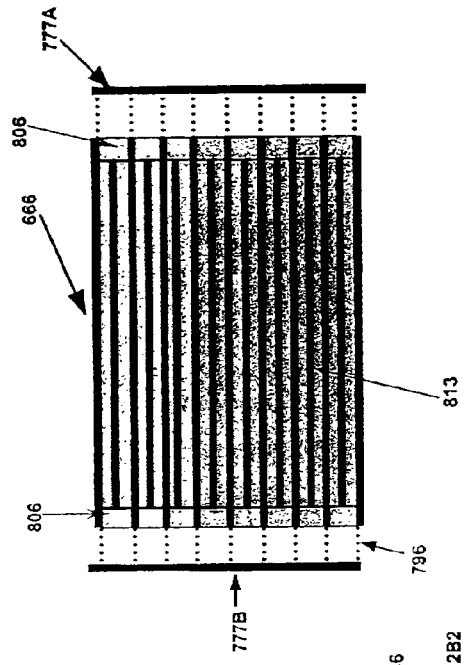
FIG. 6A is a semi-transparent, top plan view of at least one embodiment of a number of possible embodiments of the energy pathway arrangement.
Figure 6B:
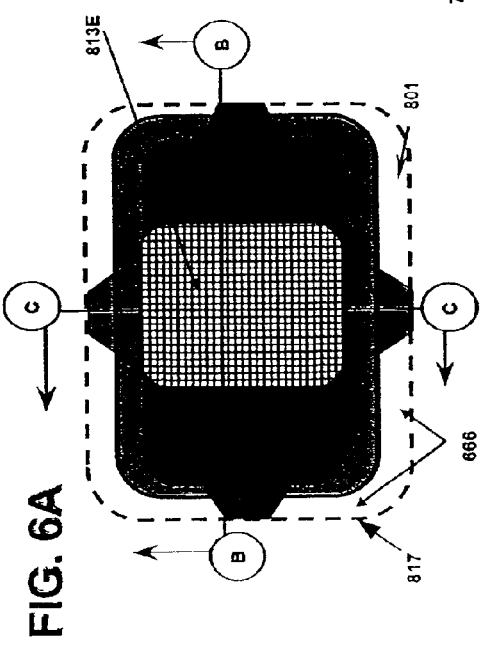
FIG. 6B is a "999B" cross-section view of at least one embodiment of a number of possible embodiments of the energy pathway arrangement with various selected areas of predetermined energy portion interactions as illustrated in FIG. 6A.
Figure 6C:
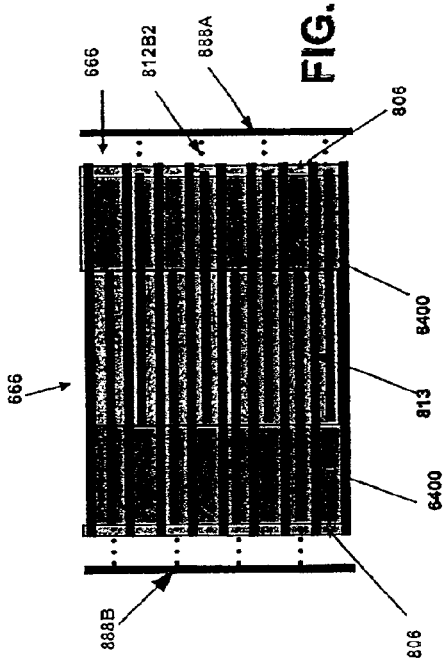
FIG. 6C is a "999C" cross-section view of at least one embodiment of a number of possible embodiments of the energy pathway arrangement with various selected areas of predetermined energy portion interactions as illustrated in FIG. 6A.

With respect to FIGS. 1, 2, and 3, at least one embodiment of a number of possible embodiments of an energy pathway arrangement having complementary energy pathways and/or shielding energy pathways, which may each include elongated extenders or extensions, such as electrode lead portions 812"XX" and 79G, respectively. Main-body portion 80 and 81, of complementary energy pathways and/or shielding energy pathways, respectively, may include, or be electrically connected to, these electrode lead portions 812"XX" and 79G, respectively. For the energy pathways having a main body 80, and the extender(s) 812"XX" for 812A1, for example, may have the main-body portion 80 being at least partially, registered between a nearby or adjacent sandwiching, shielding energy pathways and/or the respective main body portion 81s.

A portion of a cage-like conductive shield structure for use in accordance with at least one embodiment of a number of possible embodiments of an energy pathway arrangement is illustrated in FIGS. 1–3. FIG. 3A shows a portion of a cage-like electrode shield structure 400 that is similar to that of FIGS. 1–3, and a like-cross-sectioned 999 for similar like embodiments is depicted FIG. 3B and FIG. 3C. In FIG. 1, a centrally positioned and commonly shared shielding energy pathway 800/800-IM is shown deposed upon a portion 800-P, or portion of material 801, having predetermined properties. Energy pathway 800/800-IM, bypass electrodes 855BT and 855BB, respectively, deposed upon material portions 801 or plates of material 801 can be 855BT-P and 855BB-P, respectively. Plates 855BT-P and 855BB-P may be at least a portion of material 801 having predetermined properties, disposed in a generally parallel sequential stack positioned to sandwich the shared centrally positioned shielding energy pathway 800/800-IM-P.

Shielding energy pathway 800/800-IM, and bypass energy pathways 855BT and 855BB, may be disposed in a symmetrical, reversed mirrored relationship, and predicated upon a stacked sequential manufacturing operation, as set forth generally hereinabove. This positioning may result in a stacking of shielding energy pathways above and below bypass energy pathways 855BT and 855BB, and a centrally positioned pathway 800/800-IM, illustrated in FIGS. 1, 2, and 3C for example.

Positioned above and below by-pass pathways 855BT and 855BB, for example, may be a medium material 801. Centrally positioned and shared shielding energy pathway 800/800-IM, and shielding energy pathways 815, 810, and the optional shielding energy pathways 855/855-IM and 850/850-IM, and the differential bypass energy pathways 855BT and 855BB, may each include main body portions 81 and 80 generally separated by a parallel interposition or deposition of a material 801.

Each shielding energy pathway may be substantially aligned such that a superposed registration relationship results in common and shared perimeter edge alignments of substantially all of the shielding energy pathway edges 805. The 805 edges may be located around the co-planar perimeter of each shielding energy pathway, and may include a main portion 81 integral to each respective shielding energy pathway, and an contiguous extension, such as extension 79G as discussed hereinabove.

Contiguous electrode extensions 79G may be aligned portions of conductive material 799 formed contiguously with each shielding energy pathway 855/855-IM, 845, 835, 825, 815, 800/800-IM, 810, 820, 830, 840 and 850/850-IM, as illustrated in FIGS. 1–3, and made or manufactured in form extend away from the main body portion 81 of each, respectively, towards a perimeter and/or boundary edge 817. Each contiguous extension 79G may eventually be coupled to conductive portion 802B or 802A, respectively. In addition an interconnected shielding conductive structure, including shielding energy pathways that at least share one common conductive coupling with one another either, may be included in a wrap-around style as a conductive material portion 802 that extends at least 270 degrees to 360 degrees around the body of at least one embodiment of a number of possible embodiments of an energy pathway arrangement, to thereby provide multiple conductive coupling locals to portions of edging 805 of each shielding energy pathway 855/855-IM, 845, 835, 825, 815, 800/800-IM, 810, 820, 830, 840 and 850/850-IM, and/or to thereby provide additional shielding isolation on all at least three of at least four sides in accordance with at least one embodiment. This at least one embodiment of a number of possible embodiments of an energy pathway arrangement may be could used with discrete chip versions of the embodiments, thus eliminating the need for both 802A and 802B portions, and with an externally located energy pathway that is not conductively coupled to the complementary energy pathways of at least one complementary energy pathway pairing. Note that U.S. Pat. No. 5,909,350, filed Apr. 8, 1997, incoporated herein by reference, includes an example of a conductive material portion 802, and may be used to illustrate this concept. Note that a predetermined, centrally positioned shielding energy pathway may serve as a balancing point or fulcrum/divider of an arrangement of balanced, 3-dimensional symmetrical layers, as to the number of layerings, positional arrangements of balanced elements, as well as to distance relationships imparted to these various elements, thereby maintaining and allowing for a resulting arrangement of balanced, 3-dimensional symmetry to exist for at least a portion of the shielding, thereby allowing for a sharing of at least one common conductive coupling to an externally located energy pathway by utilization of a single, 'wrap around' application of a conductive material 802 for use with discrete embodiments, thereby eliminating two, 'non-wrap around portions' of the same conductive material 802, now designated as portions 802A and 802B, wherein conductive material portions such as 802A and 802B maybe conductively coupled to an externally located common energy pathway.

It should be noted that substantially all of the main body 81 portions of the shielding energy pathways may be offset by at least an average predetermined distance 814 relative to a predetermined outer edge 817. In addition, the energy pathways 855BT and 855BB may be offset an additional distance 806 from the outer edge 805 of the aligned edges of the shielding energy pathways, such that a portion of an outer edge 803 of either energy pathway 855BT and 855BB can be overlapped by a portion of an edge 805 alignment of superposed shielding energy pathways. Accordingly, energy pathway 855BT and 855BB may include a conductive area operable for energy portion propagation less than the area operable for energy portion propagation, or the conductive area operable for energy portion propagations, of any given shielding area operable for energy portion propagations. Thus, any one of the sandwiching shielding energy pathways may posses a total top and bottom conductive area sum greater than the total operable area top and bottom summed of any one complementary electrodes.

In accordance with at least one embodiment of a number of possible embodiments of an energy pathway arrangement, which is operable as a portion of a circuit when conductive material portions 802A and 802B can be conductively coupled with a portion of predetermined shielding 805, wherein the differential pathway is at least partially sandwiched by at least two shieldings, and wherein each of the differential electrodes may be smaller in overall size relative to each of the superposed shieldings, the differential electrodes may be offset within the superimposed shielding, thereby creating an area 806 of gap. Thereby, at least one portion each of at least two superposed shielding energy pathways may not have directly blocked, by electrodes, a line of sight between these at least two shielding energy pathways. In the typical embodiment of FIG. 3A, single cage-like structure 800E mirrors single cage-like structure 800D, except that differential electrode 855BB may be oppositely positioned to differential electrode 855BT.

Energy pathway lead portions 79'X', 812'X' and or 798'X' are preferably conductive. These electrode lead portions 79'X' can be positioned in relative, complementary paired relationships on differing side portions sides of the energy conditioner body, and can be isolated by a larger shielding electrode 8"XX".

Differential electrodes grouping of 885BT, 865BT, 855BB, 875BB and differential electrodes grouping of 875BT, 855BT, 865BB, 885BB can be within a predetermined sequence, and 3 dimensional positioning scheme, within the common conductive, cage-like shielding structure, as shown in FIG. 3A.

For example, structures 800C, 800D, 800E, 800F, and 800G for example as shown in FIG. 3A, when taken individually, include six shieldings 825, 815, 800/800-IM, 810, 820, 830, and, when operable as shielding structures 900A, 900B, 900C, the six shieldings 825, 815, 800/800-IM, 810, 820, 830 can be in a predetermined interweaved, overlapping manner such that the operable shielding structure 900A utilizes shielding 800/800-IM, 810, 820, while operable shielding structure 900B utilizes shielding 815, 800/800-IM, 810, and while operable shielding structure 900B utilizes shielding 810, 820, 830. It is of interest to note that shielding 810 can be utilized by all three operable shielding structures 900"X". Together, 800E and 800F create a single and larger common conductive cage-like electrode shield structure 900A that acts as a paired shielded conductive container, and 800E and 800F also make up portions of 900C and 900B, respectively.

Each container 800"X" may include an equal number of same sized, differential electrodes that are not necessarily physically opposing, within larger structure 900"X". Each container 800"X" may be oriented in a generally homogenous physical and electrically parallel and common manner. Larger, cage-like conductive shielding structure 900A, with co-acting 800E and 800F individual shield-like conductive structures, when energized, and attached to the same external common conductive path area (not shown) by conductive material portions 802A and 802B, such as by reflux solder conductive epoxies, adhesives, and the like, as will be apparent to those skilled in the art.

In FIG. 1, the central shielding energy pathway 800/800-IM, with respect to the interposition between the differential electrodes 855BT and 855BB, within the outer two additional sandwiching shielding energy pathways 815 and 810, forms an un-energized, cage-like electrode shield structure 900B. The central shielding energy pathway 800/800-IM may thereby be used simultaneously, by both differential electrodes 855BT and 855BB, but produce opposite results with respective to charge switching. The offset distance and area 806 enables the shielding energy pathway 800/800-IM to extend beyond the alignment of energy pathways 855BT and 855BB, in order to provide a shield against portions of energy flux fields which might have extended beyond the edge 803 of the energy pathways 855BT and 855BB, were it not for the electrostatic shielding effect of the energized faraday-like cage systems resulting in reduction of near field coupling between other energy pathways 855BT and 855BB, and/or between external differential energy pathways coupled thereto.

The horizontal 806 area may be, for example, approximately between 0 to 25+, or more, times the vertical distance between the energy pathways 855BT or 855BB and the shielding energy pathway 800/800-IM. This offset distance 806 can be optimized for a particular application, but all distances of overlap 806 among each respective pathway are ideally approximately the same, on average. Minor size differences can be unimportant in area 806 between pathways, as long as electrostatic shielding of FIG. 2, for example, is not entirely compromised.

In order to couple electrode 855BT or 855BB to external energy pathways positioned external to 855BT or 855BB, such as on either side of 800B, respectively, the energy pathway 855BT and 855BB may have one, or a plurality of, portions 812, which extend beyond the edge 805 of the superposed shielding 800/800-IM, 810 and 815, by extensions 812A and 812B. These extensions can be, in-turn, conductively coupled to material 890A and 890B, which enables the by-pass energy pathways 855BT and 855BB to be electrically coupled to externally located, differential energy pathways on either side electrically of shielding pathway 800/800-IM. The multi-layer components may include at least one material 890A and/or 890B, and a plurality of electrical terminal portions 802A, 802B, wherein each material 890A or 890B may be conductively coupled to at least the first electrode, or the second electrode, respectively as shown in FIG. 2. For example, multi-layer components may be arranged to define a decoupling capacitor for a multiprocessing unit, a connector assembly, a bypass and decoupling capacitor, a bypass capacitor array, or a feed-thru capacitor array, due to the fact that at least three elements can be providing simultaneous cancellation and/or suppression and/or other energy conditioning functions, such as simultaneous, common mode and differential mode filtering.

Furthermore, a cage-like effect, or electrostatic shielding effect, wherein electrically charged containment of internally generated energy parasitics, occurs to shield from the respectively paired, complementary energy pathway main-body portion 80s. Partial electrostatic shielding provides a protection to prevent escaping of a portion of internally generated energy parasitics to a nearby mated, complementary conductive energy pathway. Electrostatic shielding function also aids in a minimization of energy parasitics attributed to the energized complementary energy pathways by at least substantially immuring, or substantially physical shielding, of a balanced and/or proportional symmetrically matched insetting of predetermined complementary energy pathways within a predetermined area It should also be noted, with respect to FIG. 3B and FIG. 3C, that the interposition of conductive and non-conductive material portions that include material 801 'shielding' functions can be utilized despite a very small distance of separation of oppositely phased electrically complementary operations contained within common energy pathways. Operations may additionally occur when coupling to a common conductive portion has been made such that energy portions utilizing various electrically opposing equally sized energy pathways opposites can be operable to interact in a manner balanced between the opposite sides of a common conductive shield structure.

Exceptional mutual energy flux cancellation of various portions of energy propagating along paired and electrically opposing conductive energy pathways that can be spaced-apart from one another by a very small distance(s) of either or both direct and indirect separation of oppositely phased electrically complementary operations, with a simultaneous stray parasitic suppression and containment functions, operate in tandem enhance functionality of an exemplary embodiment. H-field field flux propagates by Ampere's law along a transmission pathway, trace, line or conductor or conductive layer portion. In an embodiment wherein an energy-in pathway and an energy-return pathway can be brought very close to each other, almost directly adjacent and parallel with minimal separation by only at least two portions of material 801 and a shielding energy pathway, and corresponding complementary energy field portions may be combined for mutual cancellation or minimization of the separate individual effect. The closer the complementary symmetrical pathways can be brought together, the better the mutual cancellation effect may be.

Certain shielding energy pathways, such as can be shown as #-IM'X', can be additionally placed shielding energy pathways located outside of, and sandwiching in close proximity the balance of, the energy pathways of at least one embodiment of a number of possible embodiments of an energy pathway arrangement.

As disclosed in FIG. 3B, FIG. 8B and FIG. 8C, additionally placed, outer shielding energy pathways can be designated as -IMO-'X'. Additionally placed, inner shielding energy pathways can be designated as -IMI-'X', with the exception of 8"XX"/8"XX"-IM-C, and may be optional. Additionally placed, outer and inner shielding energy pathways may also be conductively coupled to the other shielding energy pathways and one another, to center shielding energy pathway designated 8"XX"/8"XX"-IM, and to almost any other members of the plurality of shielding energy pathways in a final static form of at least one embodiment. It is contemplated that additional numbers of centrally positioned common energy pathway electrodes 8"XX"/8"XX"-IMs, totaling to an odd number integer that can be added to the existing central positioned shielding, energy pathway or shielding energy pathway 8"XX"/ 8"XX"-IM, may provide specific and distinct features that can enhance the multi-circuit energy-conditioning.

In FIG. 3B and FIG. 3C, a spacing separation distance that could be filled using portions of 801 material, for example, can be designated 806, 814, 814A, 814B, 814C, 814D, 814E, 814F and can be normally final to a device-relevant configuration.

Separation or spacing distances 806, 814, 814A, 814B, 814C, 814D, 814E, 814F, 814E, for example, may be generally a portion of three dimensional separation distance or proximity of spacing found between nearly adjacent or nearby stacked energy pathway materialss formed to be energy pathways and/or electrode portions, such as 814E, and designate a relationship between shielding energy pathway 825 and shielding energy pathway 815, for example, and may include not only a portion of complementary energy pathway 865BT, but at least a portion of material 801 or equivalent, in order to aid in the support of energy pathways and the separation or spacing functions desired. It should be noted that spacing 666 designates an area that can be found within, or beyond, a 817 perimeter, for example, wherein minimal to no simultaneous energy conditioning functions may be operable as described herein.

In an embodiment, a multi-layer component of an energy pathway arrangement may include at least three common-sized and superposed, shielding electrodes that are conductively coupled to each other and that can be formed upon support material having predetermined properties. At least a first electrode and at least a second electrode can be formed in a predetermined manner upon the support material having predetermined properties, and the first electrode can be then stacked between at least two common-sized electrodes of the at least three common-sized electrodes. The second electrode can be stacked between at least two common-sized electrodes of the at least three common-sized electrodes, and thereby the first electrode and the second electrode sandwich the one centered common-sized electrode of the three common-sized electrodes, while the first electrode and the second electrode may be substantially equally offset relative to the three common-sized electrodes, such as by a predetermined distance, and the support material may isolates the three common-sized electrodes from the first and the second electrodes, thereby preventing a direct conduction coupling between the first and the second electrodes and the at least three common-sized electrodes Thereby, the first electrode can be stacked between at least two common-sized electrodes of the at least three common-sized electrodes, and the second electrode can be stacked between at least two common-sized electrodes of the at least three common-sized electrodes, and thereby the first and second electrodes sandwich at least a portion of the at least one centered common-sized electrode of the at least three common-sized electrodes, such that the first electrode and the second electrode may be substantially equally offset relative to the at least one centered common-sized electrode, to prevent a direct electrical coupling between these electrodes to form a non-discrete or discrete energy conditioning electrode structure.

It will be apparent to those of ordinary skill that the shape, thickness or size of elements discussed herein may be varied, dependant upon the electrical application. The elements of an exemplary embodiment may be so-varied wherein arrangements of energy pathways forms at least two predetermined conductive shielding containers, which subsequently create at least one larger, at least partial faraday cage-like shield structure, which in turn provides shielding functions simultaneously under certain conditions, such as at energization, for portions of complementary paired differential electrodes that operate with the disclosed principals in either a discrete or non-discreet variant, such as in combination with at least one energized circuit portion.

An embodiment of a typical energy pathway arrangement is shown in FIGS. 4A, 4B, and 4C as a complementary, symmetrically balanced energy pathway arrangement. Looking particularly to FIG. 4C, a plurality of consecutively superposed energy pathways 815, 855BT, 800/800-IM, 855BT, and 810 are shown. These energy pathways may be composed of a material 801 having varistor material properties, or predominately ferromagnetic material properties, or predominately dielectric material properties, for example, and may be spaced-apart as shown by 806, 814, 814A, 814C, 814D, 814E, 814F. Each subsequent energy pathway is superposed upon the previous energy pathway, such as, for example, wherein the third pathway 800/800-IM is positioned above the second pathway 855BB. The first energy pathway 815 may be conductively coupled to both the third pathway 800/800-IM and the fifth pathway 810, thereby creating a set of shields. Each pathway of the set of shields may be substantially the same size.

Conductively isolated from the shields is a set of electrodes. The set of electrodes 800 includes a second energy pathway 855BT at least partially conductively isolated from the fourth energy pathway 855BT. The electrodes have similar conductive areas 80 arranged facing each other. Each electrode is substantially the same size and is smaller than each shield.

In FIG. 3A, an example of a multi-layer component as described could also include at least one or more electrode coupling material portions, such as 890A and 890B, used for external conductive 'liaison' between internal and external energy pathways. It should be noted that coupling material portions, such as 802A and 802B, 890A and 890B, can be substituted by almost any methodology of 'liaison', or direct coupling conductive elements, for circuit connection. For example, in FIG. 4B and FIG. 4C coupling conductive elements are shown as via hole conductors, such as via hole conductor 888A, coupled conductively by common conductive coupling processes known in that art, to at least first electrode plurality of 885BT, 865BT, 855BB, 875BB, and via hole conductor 888B is additionally coupled conductively to at least second electrode plurality of 875BT, 855BT, 865BB, 885BB, while via hole conductor 777A and via hole conductor 777B for example, can be both conductively coupled to 845, 835, 825, 815, 800/800-IM, 810, 820, 830, 840, respectively to be eventually coupled conductively common to an external common energy pathway, if desired.

Other energy pathway arrangements of FIGS. 4A–4C can be also operable as at least bypass propagation mode 855BT, 855BB energy pathway arrangements, wherein the first, the third, and the fifth pathway 815, 800/800-IM, 810 can be operable as shielding of a portion of at least the second energy pathway and the fourth energy pathway 855BT, 855BB, and wherein the plurality of pathways 815, 855BT, 800/800-IM, 855BB, 810 may also operable together as a portion of a capacitive network. The energy pathway arrangement is practicable for simultaneous common mode and differential mode filtering with a surge protection function. At least one shield, as shown by example 800/800-IM, of the plurality of shields 815, 800/800-IM, 810 may be operable for receiving a voltage bias and/or a voltage divider, and a line-to-line capacitance value of approximately half of the line-to-ground capacitance value.

The energy conditioner of FIGS. 4A–4C may include at least two outer, superposed electrodes coupled to the plurality of shields, which shields may be made from a material having dielectric, varistor, or ferrite properties, and which superposed electrodes may be operable as a voltage divider. These two outer, superposed electrodes will, in an typical embodiment, be conductively coupled to another element, such as a substrate, a motor, and a circuit, for energized operations, for performing simultaneous, common mode and differential mode filtering for a circuit assembly serving an energy-utilizing load.

In accordance with at least one embodiment of a number of possible embodiments of an energy pathway arrangement, energy conditioners of FIGS. 4A–4C operate to prevent the escape of portions of near field electrical flux from within portions of the overall the energy conditioner of FIGS. 4A–4C, while also sustaining electrostatic shielding of portions of a total amount of energy parasitics. The energy conditioner of FIGS. 4A–4C can be operable as a portion of a sensor, or portion of an operational amplifier circuit assembly, either as a discrete or non-discrete component. In an embodiment, the number of pathways, common energy pathway electrodes, equally-sized differentially charged bypass electrodes, and feed-thru conductive energy pathway electrodes, can be multiplied in a predetermined manner to create a number of conductive energy pathway element combinations in a generally physical parallel and electrically parallel relationship, which physically and electrically parallel arrangement may be electrically parallel with respect to energized positioning between at least a circuit energy source and at least a circuit energy-utilizing load. This circuit assembly configuration will also thereby create increased capacitance values.

Referring to FIGS. 4A–4C, a common conductive shield structure may be utilized. Any outer conductive elements used for circuit attachment are not shown herein. In addition, utilizing materials having predetermined properties 801 categorized primarily for a certain electrical conditioning function or results is contemplated by the applicant. This includes a layered application that uses non-discreet capacitive or inductive structure or electrode within a manufactured non-discrete integrated circuit die, for example, a super capacitor application, or a nano-sized energy-conditioning structure. For example, the discrete energy pathway arrangement may be operable to have material portions 801 made of a resin material. Likewise, the formation of discrete energy pathway arrangement might involve a firing or a heating process to raise a temperature of at least a portion of the energy pathway arrangement by at least 15 degrees Celsius within a 30-minute period, or by using photolithography.

FIGS. 5A, 6A, 7A, and 8A show a plurality of shields 845, 835, 825, 815, 800/800-IM, 810, 820, 830, 840 of substantially similar size and shape. The plurality includes at least a first, a second, and a third shield 810, 800/800-IM, 815, which can be conductively coupled to both 777B, 777A. The first electrode 855BB and the second electrode 855BT can be disposed substantially isolated and shielded from each other, in a symmetrical and mutually complementary orientation. The first electrode and the second electrode each have at least one corresponding face-to-face electrode portion 813E that is equal in size. The non-face to face electrode areas found occupying a portion of ALI regions, such as 6400, 6500, may be substantially equal in size. Each electrode can have a face-to-face electrode area, and/or propagation area 813E, that is substantially equally proportional in size to its non-face-to-face area 6400, 6500. However, the face-to-face areas of the complementary electrodes may, in an embodiment, only be partially superimposed, as illustrated. Further, the electrodes in the illustrated embodiment may not be entirely encompassed within the outer perimeter of the shielding energy pathway superposed edges 805.

A shielding energy pathway of at least one embodiment of a number of possible embodiments of an energy pathway arrangement is shown in FIGS. 9A and 9B, and is illustrative of at least one embodiment operable with various split, energy pathway configurations. A split energy pathway 855/855-IMO-1 and 855/855-IMO-2 functions similarly to an 855/855-IMO, non-split energy pathway. All energy pathways, shields or electrodes, may include split energy pathway configurations, with the exception of any predetermined 800/800-IM centrally positioned, shielding energy pathway. A split configuration of a corresponding superposed, closely spaced pair of 855/855-IMO-1 and 855/855-IMO-2 pathways may include a 880 thin conductive or conductive-resistive material(s), minutely separated 814B by a portion of a semi-conductive or non-conductive support material 801, including an insulating material portion 801 occupying a spacing and/or distance 814B that is normally thinner, or less in volume, than a spacing and/or distance of 814 or 814A, such as the spacing found between 855/855-IMO and an adjacent shielding energy pathway 845, as shown in FIG. 8B. Split energy pathways can be beneficial in some configurations as this allows for an increase in a total energy pathway propagation area over that of a non-split energy pathway.

Larger common shielding conductors, such as 855/855-IMO may be included as part of a larger universal shielding arrangement that utilizes split pathway elements, such as for at least increasing of the energy propagation volume, as well as increasing certain other energy pathway functions, such as providing for better heat dissipation from energized operations. Split energy pathway construction may substantially increase the relative current carrying ability of such a configured energy pathway, as compared to non-split energy pathways, thereby allowing not only an increase in overall current handling ability versus a non-split configuration, but also allowing for a reduction in overall size of a comparable component of the same capacitance.

In at least one embodiment of a number of possible embodiments of an energy pathway arrangement, each respective differential conductive energy pathway pair may utilize a zero voltage reference image node created along at least a portion of the internal shielding energy pathways. Energy conditioning functions to some degree may always occur, but may be optimal in predetermined areas whereat a portion of the circuit receiving a shielding is within the footprint of a sandwiching shielding pathways.

For example, a physical shielding cage-like effect, or electrostatic shielding effect, having electrically charged containment of immured portions of internally generated energy parasitics shielded from at least partially shielded, energy pathways may provide at least some physical shielding protection from externally generated energy parasitics coupling to the same for at least a partially shielded, energy pathway.

Further, predetermined arrangements of selective interpositiing of conductive material 799 with portions of material having predetermined properties 801 allows for embodiments operable for a very small distance of separation of oppositely charged active conductive energy pathways. A relative balanced and complementary-symmetrical arrangement with respect to the center shield 8"XX", or shield 800/800-IM, is utilized as the arrangement fulcrum of balanced reciprocal conductive portions.

At least a partial flux field cancellation of energy propagating along paired and electrically opposing complementary electrodes in a balanced but shifted embodiment. Further, simultaneous stray energy parasitics, complementary charged suppression, and physical and electrostatic shielding containment may also occur. This result is achieved because the magnetic flux energies travel at least partially along the energy pathway wherein the RF return path is normally parallel and adjacent to a corresponding source energy pathway. Here, the magnetic flux energy can sometimes be measured or observed relative to a return energy pathway.

When one combines mutually opposing fields together, a cancellation or minimization effect is normally observed. The closer the complementary, symmetrically oriented shields can be brought together, the better the mutually opposing cancellation effect to opposing energy propagation is yielded. The more superposed orientation given the complementary, symmetrically oriented shields, the better result for the suppression of parasitics and cancellation effect. Correspondingly, these characteristics may be varied, for example, by the shifting discussed herein.

It is noted that paired and shifted energy pathways can be relative in balance and complementary-symmetrical and/or reciprocal positioning with respect to a predetermined, central energy pathway, such as shielding energy pathway 800/800-IM. An embodiment may include relatively shifted, balanced, complementary, and symmetrical arrangement of predetermined shields and electrodes complementarily sandwiching a centrally positioned shield, such as 800/800-IM, for example.

In accordance with at least one embodiment of a number of possible embodiments of an energy pathway arrangement like those of FIGS. 4–8C, a shifted energy pathway arrangement may include a multiplicity of layers including those arranged having a shielding energy pathway, an energy pathway, a shielding energy pathway, an energy pathway, and a shielding energy pathway, in a non-shifted, or a shifted, manner. Each of these multiplicity of layers is centered about, and complementary about, a predetermined, centrally located, shielding energy pathway, and the multiplicity is centered about a predetermined center shielding energy pathway. Complementarity and balance can be maintained about the predetermined center shielding energy pathway, although individual shielding energy pathways, and/or energy pathways, may be shifted to create discrete offset or shifted complementary energy pathways in predetermined arrangement that maintains overall balance and symmetry between a predetermined matched, energy pathway pair. Further, this shifting of complementary energy pathways may expose at least one complementary energy pathway, at least in part, outside the perimeter of the superposed shielding energy pathways, thereby allowing for parasitics, leakage, and the like, and thereby varying, for example, desired impedance characteristics for a predetermined circuit portion.

For example, a given electrode may be shifted 5 points to the left. This shifting must be accounted for in the matched pairs about a center shield, and, consequently, either an adjacent matched pair electrode of opposing polarity may be shifted 5 points, or 5 adjacent electrodes of opposite polarity may each shift 1 point, thereby maintaining balance and complementarity. The same is true wherein a shield is shifted to a greater degree over an electrode of a given polarity, and an electrode having opposite polarity is shifted in an opposite manner to maintain balance and complementarity. Further, energy pathways may remain within the perimeter of the superposed shielding energy pathways, and nonetheless be shifted thereunder. Such a shifting under the shielding energy pathways may, nonetheless, make desirable a symmetry and balancing overall. However, certain typical embodiments, such as that of FIG. 6A, wherein the electrodes can be pulled toward the center of a shield and remain under the shield, may evidence differing electrical characteristics, such as inductive behavior, while maintaining a desired, balanced, symmetrical state.

It should be noted that, in accordance with at least one embodiment of a number of possible embodiments of an energy pathway arrangement, it is practicable to emulate a center tap of resistor/voltage divider network. Other energy conditioning functions may be provided by the at least partial physical shielding, such as a decoupling function, transient suppression function, complementary energy cancellation function, energy blocking function, and energy parasitic suppression function. It should be noted that the just stated electrostatic shielding may occur upon energization and/or predetermined attachments or couplings of various energy pathways into various predetermined circuit portion configurations.

A resistor/voltage divider network can be normally constructed using a ratio of various integrated circuit resistors. However, various integrated circuit resistors may be replaced by the use of an exemplary embodiment, utilizing either specific conductive/resistive materials 799A, or utilizing naturally occurring resistance properties of almost any type or combination of material operable as an conductive material 799, or by varying the physical layout, such as the alignment, superimposition, or complementarity, of the final matched pairs. A voltage dividing function will also be present as portions of a common and shared electrode shield structure can be utilized to define a common voltage reference located at both respective sides of the common electrode shield structure instantaneously for at least a portion of a circuit.

In accordance with at least one embodiment of a number of possible embodiments of an energy pathway arrangement, unwanted energy parasitics originating from either, or both, of the paired and oppositely co-acting, differential electrodes, may be at least partially minimized or suppressed, such as upon conductive coupling to circuitry, due to operation of an exemplary embodiment in a substantially balanced manner in accordance with the physical positions and arrangement of the shielding energy pathways. Further, in accordance with at least one embodiment of a number of possible embodiments of an energy pathway arrangement, portions of un-wanted energy parasitics and energy fields in a subsequent circuit, in the form of both differential mode and common mode energies, may be minimized.

As illustrated herein, examples of the possible energy-conditioning arrangement(s), and variants thereof, have been shown and described, and it is clearly conveyed and understood that other modifications and variations may be made thereto by those of ordinary skill in the art without departing from the spirit and scope of an exemplary embodiment. It should also be readily understood and appreciated that various aspects and element limitations of the various embodiments and elements shown may be interchanged, in whole, and/or in-part, and/or by modification, such that the preceding discussion is made by way of example only, and that it is not intended by the applicant to be limiting of an exemplary embodiment as further described in the claims appended hereto.

What is claimed:

1. An energy pathway arrangement, comprising:
   a plurality of superposed and conductively coupled energy pathways;
   wherein said plurality includes at least a first, a second and a third superposed energy pathway;
   at least a first and a second energy pathway of substantially similar size and shape;
   wherein said first energy pathway is at least partially shielded and sandwiched by the first and the second superposed energy pathway, and wherein said second energy pathway is at least partially shielded and sandwiched by the second and the third superposed energy pathway;
   wherein said first and said second energy pathways each have at least a corresponding, face to face area, wherein each of the face to face areas comprises a first surface area, and wherein said first and said second energy pathways each have at least a corresponding, non-face to face area, wherein each of the non-face to face areas comprises a second surface area; and
   wherein each first surface area is proportional to each second surface area.

2. An energy pathway arrangement, comprising:
   a first energy pathway;
   a second energy pathway;
   a first superposed energy pathway;
   a second superposed energy pathway;
   a third superposed energy pathway;
   wherein said first energy pathway is located in between said first superposed energy pathway and said second superposed energy pathway;
   wherein said second energy pathway is located in between said second superposed energy pathway and said third superposed energy pathway;
   wherein said first energy pathway consists essentially of a first face to face area and a first non-face to face area; and
   wherein said second energy pathway consists essentially of a second face to face area and a second non-face to face area;
   wherein said first face to face area and said second face to face area are equal in size to each other and completely overlap with each other.

3. The arrangement of claim 2, wherein said first energy pathway and said second energy pathway are substantially of the same size and shape.

4. The arrangement of claim 2, wherein said first non-face to face area and said second non-face to face area do not overlap with each other.

5. The arrangement of claim 4, wherein said first non-face to face area and said second non-face to face area are substantially of the same size.

6. The arrangement of claim 5, wherein said first face-to face area and said second face to face area are greater in size that said first non-face to face area and said second non-face to face area.

7. The arrangement of claim 5, wherein said first face-to face area and said second face to face area are approximately equal in size that said first non-face to face area and said second non-face to face area.

8. The arrangement of claim 5, wherein said first face-to face area and said second face to face area are smaller in size that said first non-face to face area and said second non-face to face area.

9. The arrangement of claim 2, wherein said energy pathway arrangement is a stacked energy pathway arrangement.

10. The energy arrangement of claim 2, wherein said energy pathway arrangement defines a central superposed energy pathway; and wherein said second superposed energy pathway is said central superposed energy pathway.

11. The arrangement of claim 2, wherein said energy pathway arrangement further comprises a dielectric support material, said dielectric support material, comprising a plurality of portions; and wherein said plurality of portions supports at least said first energy pathway and said second energy pathway.

12. The arrangement of claim 2, wherein said first energy pathway and said second energy pathway comprise at least a first electrode and a second electrode.

13. The arrangement of claim 12, wherein any one superposed energy pathway of said plurality of superposed energy pathways is a shielding electrode.

14. The arrangement of claim 12, wherein at least one of said first electrode and said second electrode comprises a split-electrode.

15. The arrangement of claim 14, wherein each one of said first electrode and said second electrode comprises a split-electrode.

16. The arrangement of claim 2, wherein said energy pathway arrangement further comprises at least two outer shielding energy pathways.

17. An energy pathway arrangement comprising:
a first plurality of conductively coupled superposed energy pathways;
a second plurality of conductively coupled superposed energy pathways;
a third plurality of conductively coupled superposed energy pathways;
wherein said first plurality of conductively coupled superposed energy pathways is conductively isolated from said second plurality of conductively coupled superposed energy pathways and said third plurality of conductively coupled superposed energy pathways;
wherein said second plurality of conductively coupled superposed energy pathways is conductively isolated from said first plurality of conductively coupled superposed energy pathways and said third plurality of conductively coupled superposed energy pathways;
wherein said third plurality of superposed energy pathways is conductively isolated from said first plurality of conductively coupled superposed energy pathways and said second plurality of conductively coupled superposed energy pathways;
wherein superposed energy pathways of said second plurality of superposed energy pathways are of substantially the same size and shape as one another;
wherein superposed energy pathways of said third plurality of superposed energy pathways are of substantially the same size and shape as one another; and wherein any one superposed energy pathway of said first plurality of superposed energy pathways is larger than either (1) any one superposed energy pathway of said second plurality of superposed energy pathways or (2) any one superposed energy pathway of said third plurality of superposed energy pathways.

18. The arrangement of claim 17, wherein the number of energy pathways in said first plurality of superposed energy pathways is an odd integer; and wherein the total number of energy pathways in said second plurality of superposed energy pathways and said third plurality of superposed energy pathways sums to an even integer.

19. The arrangement of claim 17, wherein at least one superposed energy pathway of said first plurality of superposed energy pathways at least partially shields at least one superposed energy pathway of said second plurality of superposed energy pathways from at least one superposed energy pathway of said third plurality of superposed energy pathways.

20. The arrangement of claims 17, wherein said energy pathway arrangement is a stacked energy pathway arrangement.

21. The arrangement of claim 17, wherein said energy pathway arrangement further comprises a support material, said support material comprising a plurality of portions and wherein said plurality of portions supports at least one superposed pathway of said first plurality of superposed energy pathways, said second plurality of superposed energy pathways, or said third plurality of superposed energy pathways.

22. The arrangement of claim 17, further comprising a support material, wherein said support material is located such that said support material substantially isolates at least one plurality of superposed energy pathways selected from said first plurality of superposed energy pathways, said second plurality of superposed energy pathways, and said third plurality of superposed energy pathways from at least one other plurality of superposed energy pathways selected from said first plurality of superposed energy pathways, said second plurality of superposed energy pathways, and said third plurality of superposed energy pathways.

23. The arrangement of claim 17, wherein said energy pathway arrangement further comprises at least a material selected from a group consisting of insulator materials, semi-insulator materials, dielectric materials, inductive material, ferromagnetic materials, ferrite materials, shale materials, metal oxide materials, varistor materials, chemically doped materials, semi-conductive materials, and combinations thereof.

24. The arrangement of claim 22, wherein said support material comprises a resin material.

25. The arrangement of claim 22, wherein said support material comprises a ferrite material.

26. The arrangement of claim 22, wherein said support material comprises a dielectric material.

27. The arrangement of claim 2, wherein said first plurality of superposed energy pathways defines a central energy pathway; and wherein said second plurality of superposed energy pathways is positioned within said energy pathway arrangement substantially symmetrically and opposite in orientation to said third plurality of superposed energy pathways, relative to said central energy pathway.

28. A circuit comprising the energy pathway arrangement of claim 17, and further comprising
an energy source;
an energy-utilizing load; and
wherein said energy pathway arrangement maintains voltage balance between an energy source and an energy-utilizing load, relative to a common voltage reference.

29. The circuit of claim 28, wherein said energy pathway arrangement further comprises:
a neutral conductor;
a positive conductor; and
and a negative conductor;
wherein said neutral conductor is conductively coupled to said first plurality of superposed energy pathways by at least a first conductive material portion;
wherein said positive conductor is conductively coupled to said second plurality of superposed energy pathways by at least a second conductive material portion; and
wherein said negative conductor is conductively coupled to said third plurality of superposed energy pathways by at least a third conductive material portion.

30. The circuit of claim 29, wherein said first conductive material portion is not superposed to the at least said second conductive material portion.

31. The circuit of claim 29, wherein said second conductive material portion is not superposed to the at least said third conductive material portion.

32. The circuit of claim 29, wherein said first conductive material portion is not superposed to the at least said third conductive material portion.

33. The arrangement of claim 2, wherein said energy pathway arrangement further comprises at least two outer shielding energy pathways.

34. The arrangement of claim 17, wherein said energy pathway arrangement further comprises at least two outer shielding energy pathways.

35. A method of using said arrangement of claim 2 comprising connecting said energy pathway arrangement in a capacitive network.

36. A method of using said arrangement of claim 17 comprising connecting said energy pathway arrangement in a capacitive network.

37. A method of using said arrangement of claim 2 comprising operating said energy pathway arrangement as a voltage divider.

38. A method of using said arrangement of claim 17 comprising operating said energy pathway arrangement as a voltage divider.

39. A method of using said arrangement of claim 2 comprising operating said energy pathway arrangement as an energy conditioner.

40. A method of using said arrangement of claim 17 comprising operating said energy pathway arrangement as an energy conditioner.

41. A method of using said arrangement of claim 2 comprising operating said energy pathway arrangement as a capacitor.

42. A method of using said arrangement of claim 17 comprising operating said energy pathway arrangement as a capacitor.

43. A method of using said arrangement of claim 2 comprising operating said energy pathway arrangement as a bypass capacitor.

44. A method of using said arrangement of claim 17 comprising operating said energy pathway arrangement as a bypass capacitor.

45. An energy pathway arrangement, comprising:
a first plurality of conductively coupled energy pathways;
a second plurality of conductively coupled energy pathways; and
a third plurality of conductively coupled energy pathways;
wherein all energy pathways of said first plurality of conductively coupled energy pathways are of substantially equal size and shape with each other;
wherein all energy pathways of said second plurality of conductively coupled energy pathways are of substantially equal size and shape with each other;
wherein all energy pathways of said third plurality of conductively coupled energy pathways are of substantially equal size and shape with each other;
wherein each energy pathway of said first plurality of conductively coupled energy pathways is substantially parallel to each other energy pathway of said first plurality of conductively coupled energy pathways;
wherein all energy pathways of said second plurality of conductively coupled energy pathways are substantially parallel to each other;
wherein all energy pathway of said third plurality of conductively coupled energy pathways are substantially parallel to each other;
wherein at least one energy pathway of said first plurality of conductively coupled energy pathways comprises at least a first non superposed area defined as the area of said at least one energy pathway that is not superposed with at least one energy pathway of said third plurality conductively coupled energy pathways;
wherein said first plurality of conductively coupled energy pathways comprises a total first non superposed area defined as the sum of said first non superposed areas of all energy pathways of said first plurality of conductively coupled energy pathways;
wherein at least one energy pathway of said second plurality of conductively coupled energy pathways comprises at least a second non superposed area defined as the area of said at least one energy pathway that is not superposed with at least one energy pathway of said third plurality conductively coupled energy pathways;
wherein said second plurality of conductively coupled energy pathways comprises a total second non superposed area defined as the sum of said second non superposed areas of all energy pathways of said second plurality of conductively coupled energy pathways; and
wherein said total first non superposed area is substantially equal to said total second non superposed area.

46. The arrangement of claim 45, wherein only one of energy pathway of said first plurality of conductively coupled energy pathways comprises said first non-superposed area; and
wherein all other energy pathways of said first plurality of conductively coupled energy pathways are substantially superposed with the energy pathways of said third plurality of conductively coupled energy pathways.

47. The arrangement of claim 46, wherein only one of energy pathway of said second plurality of conductively coupled energy pathways comprises said second non-superposed area; and
wherein all other energy pathways of said second plurality of conductively coupled energy pathways are substantially superposed with the energy pathways of said third plurality of conductively coupled energy pathways.

48. A method of making an energy pathway arrangement, comprising:
- providing a first energy pathway;
- providing a second energy pathway;
- providing a first superposed energy pathway;
- providing a second superposed energy pathway; and
- providing a third superposed energy pathway;
- wherein said first energy pathway is located between said first superposed energy pathway and said second superposed energy pathway;
- wherein said second energy pathway is located between said second superposed energy pathway and said third superposed energy pathway;
- wherein said first energy pathway consists essentially of a first face to face area and a first non-face to face area;
- wherein said second energy pathway consists essentially of a second face to face area and a second non-face to face area;
- wherein said first face to face area and said second face to face area are equal in size to each other and completely overlap with each other.

49. A method of making an energy pathway arrangement comprising:
- providing a first plurality of conductively coupled superposed energy pathways;
- providing a second plurality of conductively coupled superposed energy pathways;
- providing a third plurality of conductively coupled superposed energy pathways;
- wherein said first plurality of conductively coupled superposed energy pathways is conductively isolated from said second plurality of conductively coupled superposed energy pathways and said third plurality of conductively coupled superposed energy pathways;
- wherein said second plurality of conductively coupled superposed energy pathways is conductively isolated from said first plurality of conductively coupled superposed energy pathways and said third plurality of conductively coupled superposed energy pathways;
- wherein said third plurality of superposed energy pathways is conductively isolated from said first plurality of conductively coupled superposed energy pathways and said second plurality of conductively coupled superposed energy pathways;
- wherein superposed energy pathways of said second plurality of superposed energy pathways are of substantially same size and shape as one another;
- wherein superposed energy pathways of said third plurality of superposed energy pathways are of substantially same size and shape as one another; and
- wherein any one superposed energy pathway of said first plurality of superposed energy pathways is larger than either (1) any one superposed energy pathway of said second plurality of superposed energy pathways or (2) any one superposed energy pathway of said third plurality of superposed energy pathways.

50. The arrangement of claim 3, wherein said first energy pathway and said second energy pathway are smaller in size than any of said first superposed energy pathway, said second superposed energy pathway, and said third superposed energy pathway.

* * * * *

UNITED STATES PATENT AND TRADEMARK OFFICE
CERTIFICATE OF CORRECTION

PATENT NO. : 6,894,884 B2 Page 1 of 1
APPLICATION NO. : 10/115159
DATED : May 17, 2005
INVENTOR(S) : Anthony et al.

It is certified that error appears in the above-identified patent and that said Letters Patent is hereby corrected as shown below:

On the title page:

Item (73): should read

-- (73)  Assignee: X2Y Attenuators, LLC, Erie, PA (US) --

Signed and Sealed this

Twelfth Day of December, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,894,884 B2 |
| APPLICATION NO. | : 10/115159 |
| DATED | : May 17, 2005 |
| INVENTOR(S) | : Anthony et al. |

It is certified that error appears in the above-identified patent and that said Letters Patent is hereby corrected as shown below:

On the title page, item (63) which reads:
"(63) Continuation-in-part of application No. 09/845,680, filed Apr. 30, 2001 now Pat. No. 6,580,595, which is a continuation-in-part of application No. 09/815,246 filed Mar. 22, 2001 now Pat. No. 6,469,595, which is a continuation-in-part of application No. 09/777,021 filed Feb. 5, 2001 now Pat. No. 6,687,108, which is a continuation-in-part of application No. 09/632,048 filed Aug. 3, 2000 now Pat. No. 6,738,249, which is a continuation-in-part of application No. 09/594,447 filed Jun. 15, 2000 now Pat. No. 6,636,406, which is a continuation-in-part of application No. 09/579,606 filed May 26, 2000, now Pat. No. 6,373,673, which is a continuation-in-part of application No. 09/460,218 filed Dec. 13, 1999, now issued as Pat. No. 6,331,926, which is a continuation of application No. 09/056,379 filed Apr. 7, 1998, now issued as Pat. No. 6,018,448, which is a continuation-in-part of application No. 09/008,769 filed Jan. 19, 1998, now issued as Pat. No. 6,097,581, which is a continuation-in-part of application No. 08/841,940 filed Apr. 8, 1997, now issued as Pat. No. 5,909,350." should read:

-- (63) Continuation-in-part of application No. 09/845,680, filed Apr. 30, 2001 now Pat. No. 6,580,595, which is a continuation-in-part of application No. 09/777,021 filed Feb. 5, 2001 now Pat. No. 6,687,108, which is a continuation-in-part of application No. 09/632,048 filed Aug. 3, 2000 now Pat. No. 6,738,249, which is a continuation-in-part of application No. 09/594,447 filed Jun. 15, 2000 now Pat. No. 6,636,406, which is a continuation-in-part of application No. 09/579,606 filed May 26, 2000, now Pat. No. 6,373,673, which is a continuation-in-part of application No. 09/460,218 filed Dec. 13, 1999, now issued as Pat. No. 6,331,926, which is a continuation of application No. 09/056,379 filed Apr. 7, 1998, now issued as Pat. No. 6,018,448, which is a continuation-in-part of application No. 09/008,769 filed Jan. 19, 1998, now issued as Pat. No. 6,097,581, which is a continuation-in-part of application No. 08/841,940 filed Apr. 8, 1997, now issued as Pat. No. 5,909,350. --

UNITED STATES PATENT AND TRADEMARK OFFICE
CERTIFICATE OF CORRECTION

| | |
|---|---|
| PATENT NO. | : 6,894,884 B2 |
| APPLICATION NO. | : 10/115159 |
| DATED | : May 17, 2005 |
| INVENTOR(S) | : Anthony et al. |

It is certified that error appears in the above-identified patent and that said Letters Patent is hereby corrected as shown below:

Col. 1, line 7-30 delete
"This application is a continuation-in-part of application Ser. No. 09/845,680, filed Apr. 30, 2001 now U.S. Pat. No. 6,580,595, which is a continuation-in-part of application Ser. No. 09/815,246 filed Mar. 22, 2001 now U.S. Pat. No. 6,469,595, which is a continuation-in-part of application Ser. No. 09/777,021 filed Feb. 5, 2001 now U.S. Pat. No. 6,687,108, which is a continuation-in-part of application Ser. No. 09/632,048 filed Aug. 3, 2000 now U.S. Pat. No. 6,738,249, which is a continuation-in-part of application Ser. No. 09/594,447 filed Jun. 15, 2000 now U.S. Pat. No. 6,636,406, which is a continuation-in-part of application Ser. No. 09/579,606 filed May 26, 2000, now U.S. Pat. No. 6,373,673, which is a continuation-in-part of application Ser. No. 09/460,218 filed Dec. 13, 1999, now issued as U.S. Pat. No. 6,331,926, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350; and this application No. 10/115,159 also claim the benefit of U.S. Provisional Application No. 60/280,819, filed Apr. 2, 2001, U.S. Provisional Application No. 60/302,429, filed Jul. 2, 2001, and U.S. Provisional Application No. 60/310,962, filed Aug. 8, 2001." should read -- This application is a continuation-in-part of application Ser. No. 09/845,680, filed Apr. 30, 2001 now U.S. Pat. No. 6,580,595, which is a continuation-in-part of application Ser. No. 09/777,021 filed Feb. 5, 2001 now U.S. Pat. No. 6,687,108, which is a continuation-in-part of application Ser. No. 09/632,048 filed Aug. 3, 2000 now U.S. Pat. No. 6,738,249, which is a continuation-in-part of application Ser. No. 09/594,447 filed Jun. 15, 2000 now U.S. Pat. No. 6,636,406, which is a continuation-in-part of application Ser. No. 09/579,606 filed May 26, 2000, now U.S. Pat. No. 6,373,673, which is a continuation-in-part of application Ser. No. 09/460,218 filed Dec. 13, 1999, now issued as U.S. Pat. No. 6,331,926, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application

UNITED STATES PATENT AND TRADEMARK OFFICE
CERTIFICATE OF CORRECTION

PATENT NO. : 6,894,884 B2
APPLICATION NO. : 10/115159
DATED : May 17, 2005
INVENTOR(S) : Anthony et al.

It is certified that error appears in the above-identified patent and that said Letters Patent is hereby corrected as shown below:

Ser. No. 08/841,940 filed Apr. 8, 1997, now issued as U.S. Pat. No. 5,909,350; and this application No. 10/115,159 also claim the benefit of U.S. Provisional Application No. 60/280,819, filed Apr. 2, 2001, U.S. Provisional Application No. 60/302,429, filed Jul. 2, 2001, and U.S. Provisional Application No. 60/310,962, filed Aug. 8, 2001. --

Signed and Sealed this

Thirty-first Day of March, 2009

JOHN DOLL
*Acting Director of the United States Patent and Trademark Office*